(12) United States Patent
Huffine

(10) Patent No.: US 9,459,600 B2
(45) Date of Patent: Oct. 4, 2016

(54) METHOD AND AUTOMATION SYSTEM FOR PROCESSING INFORMATION EXTRACTABLE FROM AN ENGINEERING DRAWING FILE USING INFORMATION MODELING AND CORRELATIONS TO GENERATE OUTPUT DATA

(71) Applicant: Tennessee Valley Authority, Knoxville, TN (US)

(72) Inventor: Brian Jason Huffine, Knoxville, TN (US)

(73) Assignee: Tennessee Valley Authority, Knoxville, TN (US)

( * ) Notice: Subject to any disclaimer, the term of this patent is extended or adjusted under 35 U.S.C. 154(b) by 54 days.

(21) Appl. No.: 13/824,880

(22) PCT Filed: Nov. 9, 2012

(86) PCT No.: PCT/US2012/064463
§ 371 (c)(1),
(2) Date: Mar. 18, 2013

(87) PCT Pub. No.: WO2013/071117
PCT Pub. Date: May 16, 2013

(65) Prior Publication Data
US 2014/0297013 A1 Oct. 2, 2014

Related U.S. Application Data

(60) Provisional application No. 61/558,265, filed on Nov. 10, 2011.

(51) Int. Cl.
*G05B 13/04* (2006.01)
*G06F 17/50* (2006.01)

(52) U.S. Cl.
CPC .......... *G05B 13/04* (2013.01); *G06F 17/5009* (2013.01)

(58) Field of Classification Search
None
See application file for complete search history.

(56) References Cited

U.S. PATENT DOCUMENTS 8,442,664 B1 * 5/2013 Guglielmo ............. H01R 43/28
29/33 M
2004/0064351 A1 4/2004 Mikurak
2004/0093331 A1 5/2004 Garner et al.
2004/0243260 A1 12/2004 Law et al.
(Continued)

FOREIGN PATENT DOCUMENTS

WO WO 2009/048963 * 4/2009

*Primary Examiner* — Sean Schechtman
*Assistant Examiner* — Steven Garland
(74) *Attorney, Agent, or Firm* — Sughrue Mion, PLLC

(57) ABSTRACT

A method and an automation system for processing information extractable from an engineering drawing file. The automation system includes a controller which models in the engineering drawing file (20) at least two objects (302, 304) in a predefined format by adding at least two entities (34) to the engineering drawing file (20) (S501) and by adding support information (35) to the engineering drawing file (20) (S502) to provide the extractable information (S401), provides a program sequence (80) in an automation application (50) to establish a correlation of the extractable information (S402), correlates the extractable information by executing the program sequence (80) (S403), and generates output data (12, 15) based on the established correlation of the extractable information (S404). The correlation of the extractable information is established only while the program sequence (80) of the automation application (50) is being executed.

31 Claims, 16 Drawing Sheets

(56) References Cited

U.S. PATENT DOCUMENTS

| | | | |
|---|---|---|---|
| 2006/0100934 A1* | 5/2006 | Burr | G06Q 10/06 705/26.81 |
| 2008/0059871 A1* | 3/2008 | Ravish | G05B 19/4097 715/211 |
| 2010/0058162 A1* | 3/2010 | Coldicott | G06T 11/206 715/211 |

* cited by examiner

METHOD AND AUTOMATION SYSTEM FOR PROCESSING INFORMATION EXTRACTABLE FROM AN ENGINEERING DRAWING FILE USING INFORMATION MODELING AND CORRELATIONS TO GENERATE OUTPUT DATA

CROSS-REFERENCE TO RELATED PATENT APPLICATION

This application claims priority from U.S. Provisional Patent Application No. 61/558,265, filed on Nov. 20, 2011, the disclosure of which is incorporated herein in its entirety by reference.

BACKGROUND OF THE INVENTION

1. Field of the Invention

Apparatuses and methods consistent with exemplary embodiments generally relate to automation systems, apparatuses and methods for assisting pre-connecting and connecting of framework devices or components by connectors, and in particular, to pre-wiring and wiring of electrical devices in control panels of electrical substations by wires, to pre-connecting and connecting plumbing units of modular or prefabricated homes by pipes, or to pre-connecting and connecting optical control devices in optical telecommunication racks of a telecommunications environment by optical fibers.

2. Description of the Related Art

Electrical devices are electrically connected by electrical wires. Such electrical devices are installed, for example, in control panels of electrical substations. Electrical devices in the control panels are used to control functions of the substation and to display operating parameters. Electrical wires are also used to connect the devices in the control panels with field devices of the substation.

When electrical substations are designed, design engineers typically create engineering drawings, such as wiring diagrams, which show, for example, electrical control devices that are installed in the control panels and wires that electrically connect the control devices. These wiring diagrams may be used by construction electricians who install the electrical substations and also by field electricians who troubleshoot installation issues or technical issues during operation of the electrical substations.

Wiring diagrams can be created in the form of computer-aided design (CAD) drawings by a CAD software. An example of such a CAD software, which is used for creating CAD drawings, is AutoCAD® from Autodesk.

Engineering drawings may not simply contain graphical representations of electrical components, such as electrical devices or wires. Instead, engineering drawings may also contain additional information about the electrical components which may be extracted and imported into a data store.

U.S. Patent Publication No. 2004/0236711 describes the extraction of information about components of a design file can be automated. The extracted information is stored in a data store. This allows to index the information extracted from the design file and to link the information in the design file to entries in the data store in a persistent manner, so that a user can browse, search and display the extracted information.

U.S. Pat. No. 6,718,218 describes a CAD data object model and an interface which captures and stores information relating to CAD data. A method is provided which allows to capture, store, and retrieve CAD model data in a tool neutral from, i.e., without having to enter the CAD tool. Interfaces to object models allow tools, such as CAD tools or Product Data Management (PDM) tools to read and write data to the corresponding data sets. This allows to analyze information of interest contained in a plurality of CAD drawings.

U.S. Pat. No. 6,996,503 relates to analyzing a two or three-dimensional CAD drawing to take-off information about materials and costs to create a bill of materials (BOM) for projects in architecture, civil engineering, machinery, and facilities.

U.S. Patent Publication No. 2008/0140357 describes CAD drawings that include non-modeled or "virtual" components that are not relevant to the design process. Instead, the non-modeled components are provided to generate a more accurate BOM that includes information from the non-modeled components. A database is provided which stores a parts catalog including a set of pre-modeled elements that a designer can include in a design.

U.S. Patent Publication No. 2008/0120070 describes creating specification files used by a CAD application to create CAD drawings for plant piping design. The specification files are used to create CAD drawings that comply with industry standards and the requirements of the industry standards are incorporated in the specification files.

U.S. Patent Publication No. 2010/0241471 describes propagation of information among workflow applications. Information from various sources, including CAD tools, is represented and modeled in an animation system (animated computer graphics program). Data is collected in a master database via adapters.

In summary, in the related art, the information extracted from the CAD drawings is used to generate a Bill of Material (BOM) or for indexing components of a facility in a general database. It is also used to allow several engineers to independently access the data extracted from the CAD drawings via the data store or database into which the extracted information is imported.

SUMMARY OF THE INVENTION

However, the information that is extracted from the CAD drawings of the related art does not contain sufficient information about the interrelationship of the components modeled in the CAD drawings. Rather, only information related to uniquely identifiable items in the CAD drawings may be extracted and imported into a data store, and additional correlation information needs to be added and saved in the data store to adequately establish links between the components of the CAD drawings for further calculations based on the extracted information.

In addition, even if links between components of the CAD drawings are established by adding additional link information to a data store, for example, in which the extracted information is stored, the relationship information is generally accessible by accessing the data store. In addition, relationship information in the related art is stored in a persistent manner. Furthermore, the related art does not provide any measures to prevent access to the relationship information when it is established.

When an electrician installs wires, the electrician uses a wiring diagram to identify the electrical components to be wired, and to determine, which end of a wire needs to be connected to which terminal of the installation. Plumbers use piping diagrams for plant or home piping, for example, which provide information about sizes, materials, ratings, connection types of pipes, etc. Similar diagrams are used to install optical fibers.

When an electrician installs the wires, the electrician needs to determine the length of the wire. Similarly, when a plumber installs flexible water pipes, for example, the plumber needs to determine the length of the flexible water pipe. Even if only rigid water pipes are installed, the plumber needs to determine the length and parameters of each pipe segment and of any component that connects the pipe segments. However, conventional wiring or piping diagrams do not contain information about the lengths of the wires, pipes or pipe segments. There are also no methods or rules in conjunction with the installation or pre-installation of wires in electrical control panels, of pipes in modular or pre-fabricated homes, and of optical fibers in optical telecommunication racks that can be used to automatically calculate specific wire, pipe or optical fiber lengths based on information in the conventional wiring, piping or connecting diagrams.

As a result, the electrician needs to estimate the length of the wire, and plumbers need to estimate the length of pipes, based on their experience. In addition, wire cutting and stripping ends of the wires are performed manually at the location where the control panels are installed, e.g. at the location of a substation. As a result, the wiring of an electrical substation including the wiring of control panels, and also the process of trouble shooting in the event that an error occurs, may require a significant amount of time at high costs. In addition, based on conventional wiring diagrams, it is impossible to calculate a wire length for a wire to be pre-installed on a control panel so that the wire length can be used as a parameter to control a wire processing equipment to automatically cut wires to exact lengths and to automatically strip the wires on both ends of the wire. Similar problems are encountered when pipes or optical fibers are installed.

Furthermore, on each end of a wire, a wire tag related to an electrical circuit may be placed for later identification of the wire end. Although conventional wiring diagrams may contain identifying information about the ends of the wires, the related art does not provide any support to print this circuit-related information on wire or connector tags, or on the wires, pipes or optical fibers themselves.

In order to reduce costs and time required to install wires in an substation, control panels may be pre-wired in a wire shop, i.e., at a location apart from the location of the electrical substation. In a similar manner, pipes may be pre-installed in modular or prefabricated homes and optical fibers may be pre-installed in telecommunication racks.

In conjunction with the introduction of the pre-wire or pre-installation process, aspects of the wiring and pre-installation are automated by using an automation system which reduces the processing time, enhances product quality, improves safety and human performance, and thereby reduces costs to implement the electrical substation, to install pipes in a home, or to install optical fibers in a telecommunication environment.

For example, the automation system allows it to prepare wires by wire processing equipment which cuts the wires in length, strips the wires on both ends and prints wiring instructions on the wires. The prepared wires are then easily installed on the control panels by a wire shop electrician. Thereafter, the pre-wired control panels are transported to and installed in the substations.

In addition to preparing the wires for pre-wiring control panels in the wire shop, wires can also be prepared for installation in the field by using the automation system. In other words, the automation system is further used to cut and strip wires which are not pre-installed in the control panels in the wire shop (but which are installed by a field engineer at the location of the electrical substation) on at least one end of the wires, to, for example, connect the pre-wired control panels with other components of the electrical substation. In addition, wire tags are printed to be attached by the field engineer to the installed wires.

Although the automation systems, apparatuses and methods are described in conjunction with the implementation of a wire shop for pre-wiring control panels of an electrical substation, the application of the automation systems, apparatuses and methods is not limited to the pre-wiring of such control panels.

Instead, the automation systems, apparatuses and methods may be used in any installation process in which connectors, such as wires, pipes, optical fibers or conduits are installed in a predefined framework, i.e., in a framework in which the framework devices are connected. This includes but is not limited to, wiring of electrical devices by electrical wires, connecting of plumbing units by pipes, and connecting of optical devices by optical fibers, in a car or in an airplane, which may serve as a framework for installing connectors between devices, respectively. It also includes, but is not limited to, any type of connector in the from of a conduit that is configured to transport electrons, photons, gas, fluids or any other matter.

That is, because electrical wires, pipes and optical fibers typically have a cylindrical shape and have certain mechanical characteristics that are similar. For example, electrical wires, water pipes and optical fibers may be to a certain degree flexible and bendable.

As a consequence, applications of the automation systems, apparatuses and methods of the inventive concept may be used in all technical areas in which conduits/connectors are installed that are not electrical wires in a manner similar to their application in the process of pre-wiring or wiring of electrical control panels for electrical substations.

According to a first aspect of the present invention, there is provided a method for processing information extractable from an engineering drawing file (20) including the operations of modeling in the engineering drawing file (20) at least two objects (302, 304) in a predefined format by adding at least two entities (34) to the engineering drawing file (20) (S501) and by adding support information (35) to the engineering drawing file (20) (S502) to provide the extractable information (S401), providing a program sequence (80) in an automation application (100) to establish a correlation of the extractable information (S402), correlating the extractable information by executing the program sequence (80) (S403), and generating output data (12, 15) based on the established correlation of the extractable information (S404).

The correlation of the extractable information is established only while the program sequence (80) of the automation application (50) is executed. The at least two objects (302, 304) include, respectively, a device (302) and a connector (304), and the output data (12, 15) includes at least one of a report (12) and an equipment control file (15) containing control data configured to control an equipment (700, 800, 900). The report is at least one of (a) stored in a report file (12), and (b) displayed on a display (70).

The modeling further includes at least one of providing application process settings data (13) (S503), providing a predefined equipment control file template (111) (S504), adding attributes to the at least two entities (34) (S505), and applying a predefined format to the at least two entities (34) (S506). The correlation is a temporary configuration of the automation application (50) that establishes a temporary relationship between the at least two entities (34), the support information (35) and the application process settings data (13), thereby providing additional information beyond the information about the at least two entities (34), the support information (35) and the application process settings data (13).

The support information (35) includes at least one of general settings information (31), device specification information (32) including device descriptive characteristics, device structural characteristics, device-level connector routing characteristics, device-level process settings, device termination definitions including coordinates of the device terminations in a coordinate system calculated from a point of origin defined for each device, termination-level connector routing characteristics, termination data assignments, framework characteristics, and termination interface characteristics.

The connector specification information (33) includes circuit type definitions, connector characteristics based on an applied circuit type, connector type symbol definitions, and characteristics of a connector end to adapt the connector end to a device termination to which the connector end is connected.

The at least two entities (34) include at least one of a text string formatted according to the predefined format, layers, and blocks of grouped entities, and the application process settings data (13) contain parameters for executing the automation application (50).

In addition, the modeling further includes storing the application process settings data (13) in an application configuration file, storing at least a part of the support information in a relational database (30), and storing the predefined equipment control file template (111) in a predefined template file (11). Programmatic macros are embedded in the predefined template file (11) which are executed to convert data provided in a predefined format to a control data file format compatible with and configured to control the connector processing equipment (700).

To prevent the extractable information from being correlated without the automation program (50) being executed, the program sequence (80) is included in the automation application (50) and the at least two objects (302, 304) are modeled in the engineering drawing file (20) in the predefined format. The correlation is accessible only by the automation application (50).

The automation application provides a user interface (60) of a design processor (40) to model the at least two objects (302, 304) in the predefined format, and the output data (12, 15) includes a compatibility report which lists entities (34) and support information (35) that do not correspond to the predefined format.

The generating of the equipment control file (15) includes at least one of generating a connector tag printer control file (18) to control a connector tag printer (900), generating an engraver control file (16) to control an engraver (800); and generating a connector processing equipment control file (19) to control a connector processing equipment (700).

The at least one equipment control file (15) includes a specific file and data format required by the equipment (700, 800, 900).

The generating of the connector processing equipment control file (19) includes the operations of transmitting the connector processing equipment control file (19) to a file converter (200), converting an equipment control file format and equipment control file data of the connector processing equipment control file (19) into an equipment control file format and equipment control file data of a converted connector processing equipment control file (17) based on the predefined equipment control file template (111) when the specific file and data format is required by the connector processing equipment (700).

The connector processing equipment (700) is configured to cut a connector (304) to a length, to print information on the connector (304), and to prepare both ends of the connector (304) for installation, and the information printed on the connector (304) includes at least one of installation instructions, at least a part of the connector specification information (33), a connector tag, a destination, a source, and routing information.

The generating of the connector processing equipment control file (19) includes the operation of calculating an adjusted total connector length of a connector (304) based on the correlated extractable information. The correlated extractable information includes information defining the topology of framework devices (302) based on a coordinate system of each framework device (302), locations of terminations (310) to which the connector (304) is connected in the coordinate system of each of the framework devices (302), information defining the topology of the framework (301) based on a coordinate system of each framework (301), and locations of framework devices (302) in the coordinate system of each framework (301).

According to a second aspect of the present invention, the calculating of the adjusted total connector length includes the operations of extracting the extractable information (S507), correlating the extractable information (S508), calculating a total unadjusted connector length based on at least one of a plurality of connecting scenarios (A-G) (S509); and adjusting the total unadjusted connector length (S510).

The extracting of the extractable information (S507) includes the operations of retrieving information about the at least two entities (34), retrieving at least a part of the support information (35), and retrieving the application process settings data (13).

The plurality of connecting scenarios (A-G) includes the following scenarios:

(A) routing the connector (304) around devices (302, 303) located above or below each other and along a framework boundary, (B) routing the connector (304) around devices (302, 303) located side-by-side, (C) routing the connector (304) from a framework device (302) to a selected termination interface (305), (D) routing the connector (316, 317) from a first termination interface (305) to a second termination interface (306, 307), (E) routing the connector (304) from a first termination (308) of a single device (302) to a second termination (309) of the single device (302), (F) directly routing the connector (304) from a first device (302) to a second device (303) without routing the connector (304) around the first device (302) and the second device (303) and without routing the connector (304) along the framework boundary, wherein the first device (302) is located above or below the second device (303), and (G) directly routing the connector (304) from the first device (302) to the second device (303) without routing the connector around the first device (302) and the second device (303) and without routing the connector along the framework boundary, wherein the first device (302) and the second device (303) are located side-by-side.

According to a third aspect of the present invention, the adjusting of the total unadjusted connector length (S510) includes the operations of calculating and adding a waterfall adjustment to the total unadjusted connector length (S614), and calculating and adding a net adjustment to the total unadjusted connector length modified by the waterfall adjustment (S616).

The waterfall adjustment includes a value to adjust the length of the connector relative to lengths of a plurality of other connectors to obtain a predefined shape of a bundle formed by the connector and a plurality of other connectors (S613), and the net adjustment includes a net adjustment factor applied by adding or subtracting a fixed distance value (S618) or by applying a percent value (S617).

According to a fourth aspect of the present invention, the calculating of the total unadjusted connector length (S509) includes the operations of upon determining that the connector is a single connector (304) on a same framework device (302) (S601) and upon determining that a fixed connector length is used (S606), retrieving a fixed connector length value (S607) and setting the retrieved fixed connector length value as the total unadjusted connector length, upon determining that the connector is a single connector on a same framework device (S601) and upon determining that the fixed connector length is not used (S606) segmenting the connector (304) into a plurality of connector segments, calculating a segment connector length for each of the plurality of connector segments (S608), and calculating the total unadjusted connector length based on a summation of segment connector lengths of each of the plurality of connector segments (S605).

According to the fourth aspect of the present invention, the segmenting of the connector (304) into the plurality of connector segments and the calculating of the segment connector lengths for each of the plurality of connector segments includes the operations of calculating a connector bend radius comprising a length of a bend of the connector and adjusting each segment connector length that contains at least one bend based on the connector bend radius (S625), calculating a point of origin (325) associated with the at least one device (302) using a coordinate system associated with the at least one device (S626), calculating a jumper leave distance (S627), calculating a distance ΔX between a first x-coordinate value of a first point of termination (308) of the at least one device and a second x-coordinate value of a second point of termination (309) of the at least one device based on the point of origin (325) (S628), and calculating a distance ΔY between a first y-coordinate value of the first point of termination (308) of the at least one device and a second y-coordinate value of the second point of termination (309) of the at least one device based on the point of origin (325) (S629).

According to this aspect of the present invention, the jumper leave distance comprises a distance between the second point of termination (309) on the at least one device (302) and a point (324) extending in a direction of termination (326).

According to a fifth aspect of the present, the calculating of the total unadjusted connector length includes determining a location of the first framework device (302) and the second framework device (303) relative to each other (S602) once it has been determined that the connector extends between a first framework device and a second framework device (S601).

According to the fifth aspect of the present, upon determining that the first and the second framework devices (302, 303) are located horizontally to each other, a routing scenario is selected (S609), and upon selecting the routing scenario to extend the connector in a direct manner and with a connector segmented into a plurality of connector segments, a segment connector length is calculated for each of the plurality of connector segments (S610), and a total unadjusted connector length is calculated based on a summation of the segment connector lengths of each of the plurality of connector segments (S605).

According to the fifth aspect of the present, the segmenting of the connector into the plurality of connector segments and the calculating of the segment connector lengths for each of the plurality of connector segments (S610) includes the operations of calculating a common point of origin (327) for the first framework device (302) and the second framework device (303) using a coordinate system associated with the first and second framework devices (S630), a connector bend radius comprising a length of a bend of the connector and adjusting each segment connector length that contains at least one bend based on the connector bend radius (S631), calculating a jumper leave distance (S632), calculating a distance ΔX between a first x-coordinate value of a first point of termination (308) of the first framework device (302) and a second x-coordinate value of a second point of termination (309) of the second framework device (303) based on the common point of origin (327) (S633), and calculating a distance ΔY between a first y-coordinate value of the first point of termination (308) of the first framework device (302) and a second y-coordinate value of the second point of termination (309) of the second framework device (303) based on the common point of origin (327) (S634).

According to this aspect of the present invention, the jumper leave distance comprises a distance between the second point of termination (309) on the second framework device (303) and a point (324) extending in a direction of termination (326).

According to a sixth aspect of the present invention, upon determining that the first and the second framework devices (302, 303) are located horizontally to each other, a routing scenario is selected (S609), and upon selecting the routing scenario to extend the connector around devices and along framework boundaries, the operations of segmenting the connector into a plurality of connector segments, calculating segment connector lengths for each of the plurality of connector segments (S611), and calculating a total unadjusted connector length based on a summation of the segment connector lengths of each of the plurality of connector segments (S605) are performed.

According to the sixth aspect of the present invention, the segmenting of the connector into the plurality of connector segments and the calculating of the segment connector lengths for each of the plurality of connector segments (S611) includes the operations of calculating a common point of origin for the framework (328) (301) using a coordinate system associated with the framework (S635), calculating a connector bend radius comprising a length of a bend of the connector and adjusting each segment connector length that contains at least one bend based on the connector bend radius (S636), calculating a vertical leave distance for each of the connector ends (S637), and calculating a distance ΔX between a first x-coordinate value of a first point of termination (308) of the first framework device (302) and a second x-coordinate value of a second point of termination (309) of the second framework device (303) based on the common point of origin for the framework (328) (S638).

According to this aspect of the present invention, the vertical leave distance comprises a distance between a point of termination (308, 309) on a framework device (302, 303) and a point above or below the framework device (329, 330).

According to a seventh aspect of the present invention, upon determining that the first and the second framework devices are located vertically to each other (S602), a routing scenario is selected (S603), and upon selecting the routing scenario to extend the connector in a direct manner, the operations of segmenting the connector into a plurality of connector segments, calculating segment connector lengths for each of the plurality of connector segments (S612), and calculating a total unadjusted connector length based on a summation of the segment connector lengths of each of the plurality of connector segments (S605) are performed.

According to the seventh aspect of the present invention, the segmenting of the connector (304) into the plurality of connector segments and the calculating of the segment connector lengths for each of the plurality of connector segments (S612) includes the operations of calculating a common point of origin (327) for the first framework device (302) and the second framework device (303) using a coordinate system associated with the first and second framework devices (S639), calculating a connector bend radius comprising a length of a bend of the connector and adjusting each segment connector length that contains at least one bend based on the connector bend radius (S640), calculating a distance ΔX between a first x-coordinate value of a first point of termination (308) of the first framework device (302) and a second x-coordinate value of a second point of termination (309) of the second framework device (303) based on the common point of origin (327) (S641), and calculating a distance ΔY between a first y-coordinate value of the first point of termination (308) of the first framework device 302) and a second y-coordinate value of the second point of termination (308) of the second framework device (303) based on the common point of origin (327) (S642).

According to an eighth aspect of the present invention, upon determining that the first and the second framework devices are located vertically to each other (S602), a routing scenario is selected (S603), and upon selecting the routing scenario to extend the connector (304) around devices and along framework boundaries (312), the operations of segmenting the connector into a plurality of connector segments, calculating segment connector lengths for each of the plurality of connector segments (S604), and calculating a total unadjusted connector length based on a summation of the segment connector lengths of each of the plurality of connector segments (S605) are performed.

According to the eighth aspect of the present invention, the segmenting of the connector into the plurality of connector segments and the calculating of the segment connector lengths for each of the plurality of connector segments (S604) includes the operations of calculating a connector bend radius comprising a length of a bend of the connector and adjusting each segment connector length that contains at least one bend based on the connector bend radius (S619), calculating a vertical leave distance for each end of the connector (S620), calculating a distance to framework edge for each end of the connector (S621), calculating a distance to framework boundary for each end of the connector (S622), determining a framework device placement of the first framework device relative to the second framework device (S623), and calculating a vertical distance between points along the framework where the connector is routed (S624).

According to this aspect of the present invention, the distance to framework edge comprises a horizontal component distance from a point of termination (309) to a framework edge (331) in preparation of vertical routing. The distance to framework boundary includes a total distance from the point of termination (309) to the framework edge (331) in preparation of vertical routing, and the vertical leave distance includes a distance between a point of termination on a framework device (309) and a point above or below the framework device (332).

According to a ninth aspect of the present invention, the generating of the connector tag printer control file includes the operation of sorting connector tag labels by a framework ID, a device ID, and a termination ID. A connector tag identifies a node of a circuit between at least two terminations, and the connector tag is assigned to at least one of a plurality of connectors that connect the at least two terminations of a given node of the circuit.

According to the ninth aspect of the present invention, the device includes at least one of a control panel of an electrical substation, a modular or prefabricated home, an optical telecommunication rack, a control panel device, a plumbing unit, and an optical control device.

The framework includes at least one of the control panel, the modular or prefabricated home, and the optical telecommunication rack, and the connector includes at least one of a wire, a pipe, a conduit, and an optical fiber. The connector is configured to transport at least one of electrons, photons, gas, fluids, and other matter, and the termination interface includes at least one of an electrical terminal block, an interface at which at least two ends of two pipes or conduits are connected, and an interface at which at least two optical fiber ends are connected.

According to this aspect of the present invention, the engineering drawing file (20) includes at least one of an elevation diagram (21) which defines a layout of at least one framework (301) and a location of the at least one device (302, 303) on the at least one framework (301), and a connecting diagram (22) which defines a method of physical connecting by illustrating the at least one device (302, 303) on the at least one framework (301), at least one beginning termination (310) of at least one connector (304), and at least one end termination (311) of the at least one connector (304).

The elevation diagram (21) includes data comprising a device ID, a framework ID, a unique equipment type identifier, and device coordinates, and the connecting diagram (22) includes data comprising a device ID, a framework ID, a status identifier defining the inclusion of data, connecting termination information, a connector type assignment, a connector tag, and termination interface coordinate information.

The connecting diagram (22) includes an electrical wiring diagram, and the elevation diagram (21) comprises a front view diagram.

The connector tag includes a wire tag which identifies a node between at least two terminations of an electrical circuit, and the connector tag is assigned to at least one of a plurality of wires that connect the at least two terminations of a given node of the electrical circuit.

According to a tenth aspect of the present invention, the generating of the report includes the operations of generating at least one of a termination count report, a compatibility report, a summary connector report, a detailed connector report; and a total number of terminations report. The total number of terminations report is only displayed on the display (70) without generating a report file (12). The termination count report includes information indicating a number of terminations per framework for at least one of a field-side connection and a framework-side connection.

The termination count report, when stored in the report file (12), includes calculation equations built into the report file to allow a user to track performance of connector installation. The compatibility report includes information indicating at least one of engineering drawing file errors and physical connecting errors.

The summary connector report includes information summarizing connector routing decisions made during the connector length calculation as a guide for personnel installing framework connections.

The detailed connector report includes information regarding the connector routing decisions made during the connector length calculation as a guide for technical support personnel to assess accuracy of a given connector length calculation.

According to an eleventh aspect of the present invention, there is provided an automation system (1). The automation system (1) includes a non-transitory computer-readable medium (610) storing at least one engineering drawing file (20) and an automation application (50) comprising a program sequence (80), and a main controller (600).

The main controller (600) is configured to model in the engineering drawing file (20) at least two objects (302, 303) in a predefined format by adding at least two entities (34) to the engineering drawing file (34) and by adding support information (35) to the engineering drawing file (20) to provide the extractable information, to execute the program sequence (80) of the automation application (50) to establish a correlation of the extractable information, and to generate output data (12, 15) based on the established correlation of the extractable information.

The automation system (1) according to this aspect of the present invention further includes a connector tag printer (900) controlled by a connector tag printer controller (500) based on the at least one equipment control file (15) and configured to print connector tags, an engraver (800) controlled by an engraver controller (400) based on the at least one equipment control file (15) and configured to engrave nameplates; and a connector processing equipment (700) controlled by a connector processing equipment controller (300) based on the at least one equipment control file (15) and configured to cut a connector (304) to a length, to print information on the connector (304), and to prepare both ends of the connector (304) for installation.

The automation system (1) also includes a file converter (200) configured to convert the at least one equipment control file (15) into a format specific to the connector processing equipment (700). The correlation of the extractable information is established only while the program sequence (80) of the automation application (50) is executed.

In addition, the automation system (1) according to this aspect of the present invention includes a communication controller (90) to transmit the output data (12, 15) to the connector tag printer controller (500), the engraver controller (400), the file converter (200), and the connector processing equipment controller (300).

According to a twelfth aspect of the present invention, there is provided an apparatus. The apparatus includes a non-transitory computer-readable medium storing at least one engineering drawing file and an automation application comprising a program sequence, and a main controller.

The main controller is configured to model in the engineering drawing file at least two objects in a predefined format by adding at least two entities to the engineering drawing file and by adding support information to the engineering drawing file to provide the extractable information, to execute the program sequence of the automation application to establish a correlation of the extractable information, and to generate output data based on the established correlation of the extractable information.

According to this aspect of the present invention, the correlation of the extractable information is established only while the program sequence of the automation application is executed.

BRIEF DESCRIPTION OF THE DRAWINGS

The above and/or other aspects of the present invention will be more apparent from the following detailed description of exemplary embodiments thereof with reference to the attached drawings in which.

DETAILED DESCRIPTION OF EXEMPLARY EMBODIMENTS

Figure 1:
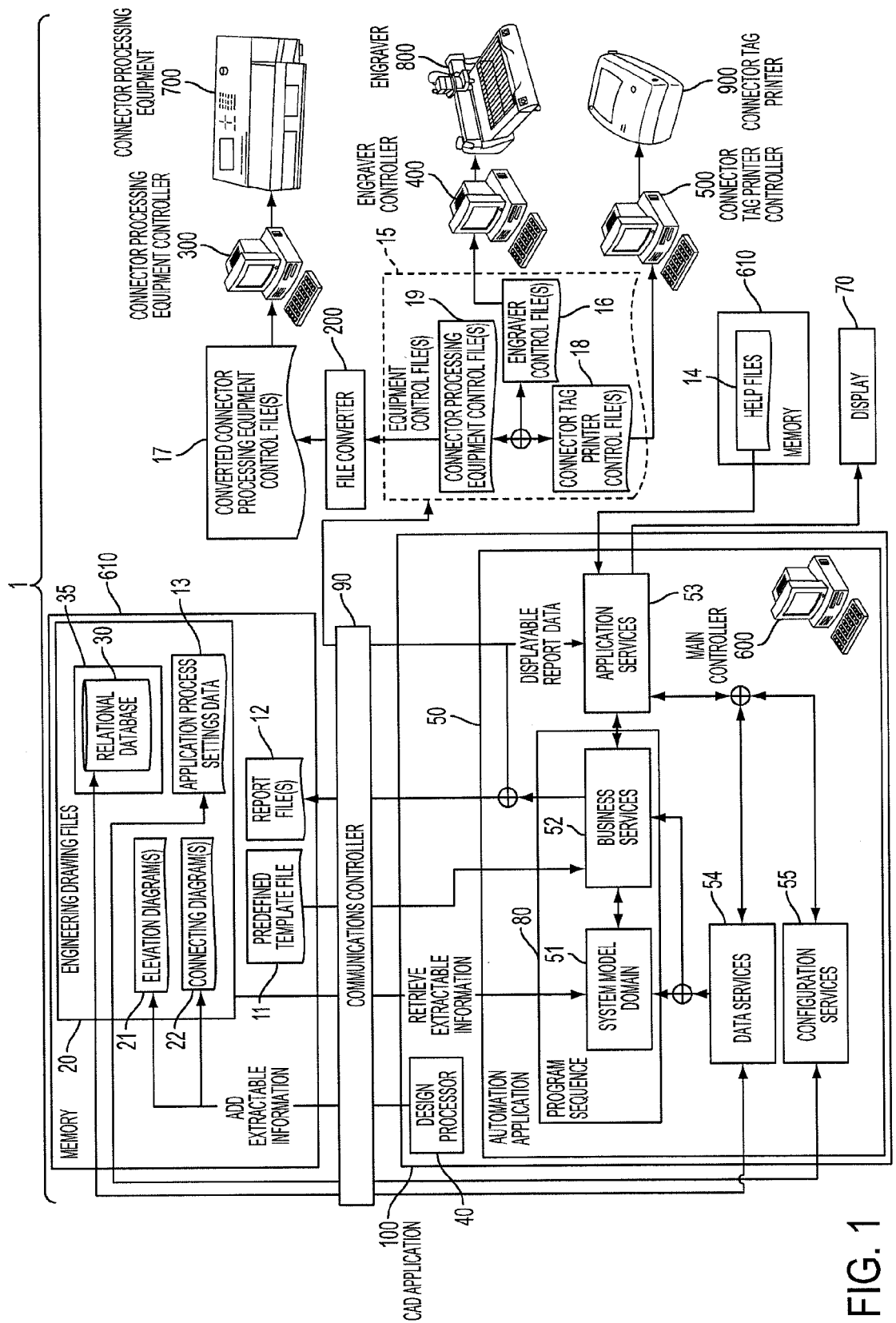
FIG. 1 is a block diagram illustrating an automation system according to an exemplary embodiment of the present invention.

Hereinafter, an exemplary embodiment of the present invention will be described in greater detail with reference to the accompanying drawings, in which the exemplary embodiment of the invention is shown.

In the following description, the same reference numerals are used for the same elements when they are depicted in different drawings. The matters defined in the description, such as detailed construction and elements, are provided to assist in a comprehensive understanding of the invention. Thus, it is apparent that the exemplary embodiment of the present invention can be carried out without those specifically defined matters. Also, functions or elements known in the related art are not described in detail since they would obscure the invention with unnecessary detail.

Automation System

FIG. 1 is a block diagram illustrating an automation system according to an exemplary embodiment of the present invention.

The automation system 1 of FIG. 1 includes a main controller 600, a memory 610 of the main controller 600 which stores engineering drawing files 20, a predefined template file 11, report files 12, and help files. Equipment control files 15, which are generated by the main controller 600 may also be stored in the memory 610. The equipment control files may also be transmitted by a communication controller 90 to a file converter 200, an engraver controller 400, a connector tag printer controller 500, and to a connector processing equipment controller 300.

The automation system 1 further includes a display unit 70, a connector processing equipment 700, an engraver 800, and a wire tag printer 900.

The main controller 600 controls a CAD Application 100 which includes an Automation Application 50 and a design processor 40. However, the automation system 1 is not limited to this configuration. Instead, the controller 600 may also control the execution of an automation application which is not included in the CAD Application. In addition, the design processor 40 may be implemented to be separate from the CAD Application. The main controller 600 may also be implemented as a plurality of controllers and different operations may be performed by different controllers.

The Automation Application 50 and the design processor 40 are implemented as in-process executable modules which are executed within the same process and memory space controlled by the main controller 600 that controls the execution of the CAD Application 100.

Figure 2:
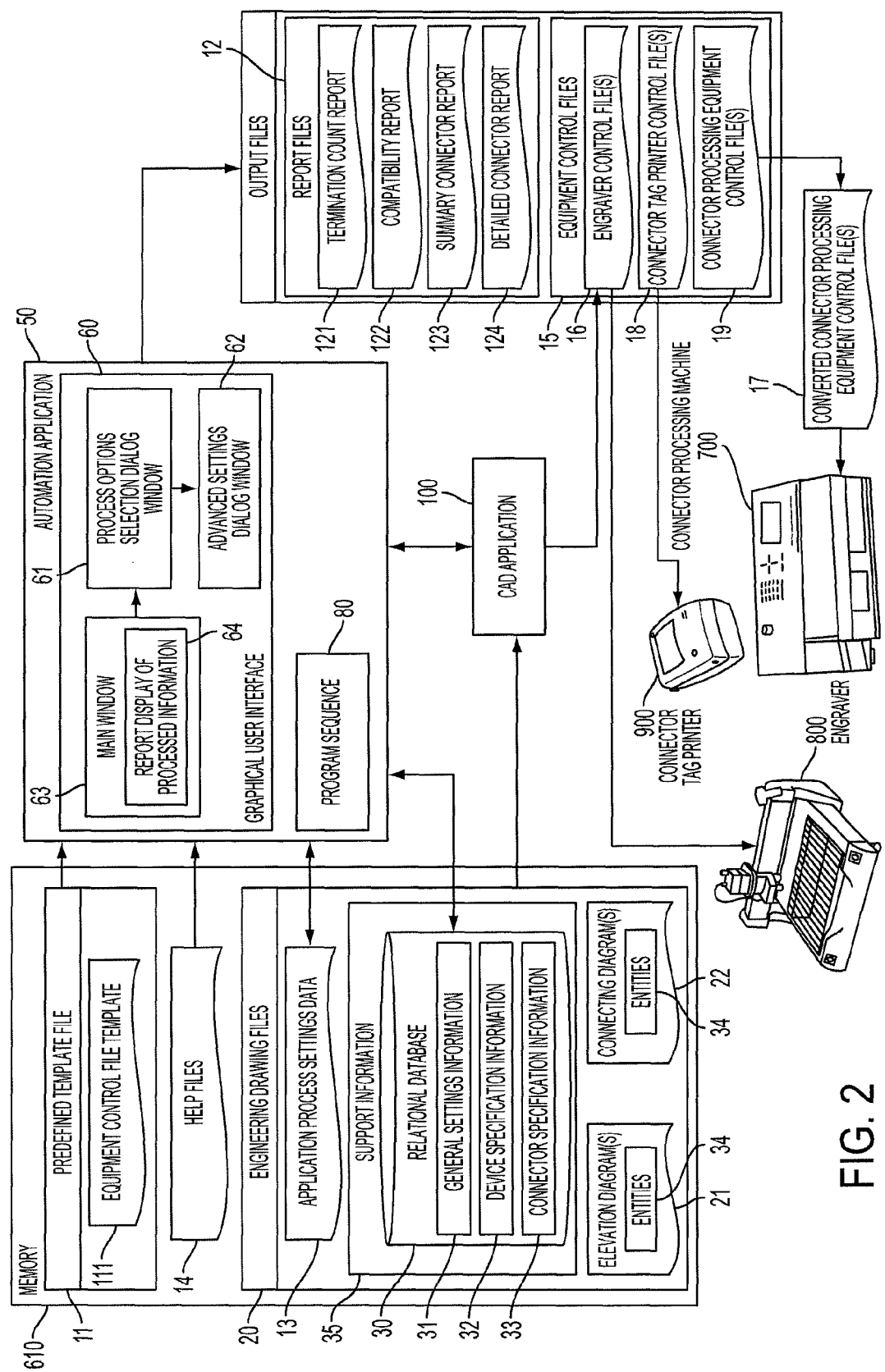
FIG. 2 is a block diagram illustrating data transmitted from and received by a WireShop Automation Application which uses a graphical user interface (GUI) of the automation system according to the exemplary embodiment of the present invention.

The design processor 40 is integrated in the CAD Application 100 and controlled by the main controller 600. When an electrical substation is designed, for example, the design processor 40 is used to model objects in engineering drawing files 20, such as for example elevation diagrams 21 and connecting diagrams 22, as shown in FIG. 2. To model the objects in the engineering drawing files 20, the design processor 40 provides a user interface displayed on the display 70 to model at least two objects in a predefined format. When the objects are modeled in the engineering drawings, entities 34, application process settings data 13, and support information 35 is added to the engineering drawing files 13. The support information 35 may be stored in a relational database 30 in the engineering drawing files 20. However, it is also possible to store the relational database 30 separate from the engineering drawing files 20 in the memory.

The memory 610 may implemented as any non-transitory computer readable medium, including hard drives, optical or magnetic disks, dynamic memory, RAM, ROM, EPROM, FLASH-EPROM, or any other memory chip or card, or memory stick.

The automation application may generate output data which includes a compatibility report which lists entities 34 and support information 35 that do not correspond to the predefined format.

The modeling of at least two objects 302, 304 in the engineering drawing file 20 in a predefined format includes adding at least two entities 34 to the engineering drawing file 20 (S501) and adding support information 35 to the engineering drawing file 20 (S502) to provide the extractable information (S401). In addition, a program sequence 80 is provided in the automation application 50 to establish a correlation of the extractable information (S402). The extractable information is correlated by executing the program sequence (80) (S403). Based on the established correlation of the extractable information, output data 12, 15 is generated (S404).

The correlation establishes a temporary relationship between the entities 34 of the engineering drawing file 20, the support information 35 and the application process settings data 13. The correlation of the extractable information is established only while the program sequence 80 of the automation application 50 is executed. In other word, the correlation only temporarily exists when the program sequence 80 is executed. In addition, since the correlation is established as a temporary configuration of the automation application 50, based on the execution of the program sequence 80 and a specific format in which the extractable information is provided, the extractable information is prevented from being correlated without the automation application 50 being executed. Furthermore, the correlation is accessible only by the automation application 50. As a result, the correlation does not exists in the memory, for example in the engineering drawing file, and cannot be accessed from any computer program other than the automation application 50. Engineering drawing files 20 are generally electronic files used with CAD software to both store and depict geometric and non-geometric entities for a particular engineering design.

Front view diagrams 21 are engineering drawings which define the layout of at least one predefined framework, such as a control panel. In addition, the front view diagram 21 defines the location of the devices, such as for example control panel devices, terminal blocks, wires, pipes, or plumbing units on the predefined framework.

Further examples of predefined frameworks are prefabricated parts of homes or telecommunication racks for fiber optics. Similar to the control devices installed on a control panel of an electrical substation, plumbing units can be pre-installed in the prefabricated parts of buildings or modular buildings and can be connected by pipes, such as for example water pipes.

In addition, in the framework of prefabricating modular homes, plumbing diagrams may be used instead of using wiring diagrams 22. Similar to the wiring diagrams 22, but not limited to, the plumbing diagrams define methods of physical pipe laying by illustrating devices installed in the prefabricated modular buildings and how these devices are connected by pipes.

A connector is a conduit through which electrons, photons, gas, fluids or other matter can be transported. A connector may represent a plurality of connectors. A connector may include, but is not limited to, a single or a plurality of electrical wires, flexible or rigid pipes or optical fibers. A device is a physical device which may represent a plurality of devices, such as control panels, control panel devices, plumbing units, etc.

The connector specification information which is added to the engineering drawing file in the relational database 30 as support information 35 contains circuit type definitions and connector characteristics that are based on or depend from an applied circuit type. A circuit can be a system that routes electrons, gas, fluids or other matter through loops. Examples of circuits are electrical, hydraulic or pneumatic circuits. The loops may include multiple devices.

In addition, in the exemplary embodiments of the inventive concept, circuits are defined in a sense that is broader than the concept of loops. In other words, circuits in the meaning of these embodiments do not only represent loops. Instead, a circuit may also represent multiple links with nodes established by connectors or by connectors that perform similar functions.

A connector tag identifies a node of a circuit between at least two terminations. A node may have multiple terminations of a connector. The connector tag is assigned to at least one of a plurality of connectors that connect at least two terminations of a given node. A wire tag is a unique identifier for a single wire/conduit/connector or a chain of wires/conduits/connectors that does not pass through a device. For example, wires may be terminated on control panel devices such that they jump from one point to the next but effectively represent a single electrical-point because they do not pass through a device. This effective "electrical-point" or node is uniquely identified by the wire tag. Wire tag labels are then placed on wires to identify each particular node. In a similar manner, labels for conduits/connectors may be generated and placed on conduits/connectors to identify particular nodes.

Termination interfaces are devices that contain two or more terminations to which ends of connectors are attached. The terminations may function as adapters.

An exemplary embodiment of a termination interface is a terminal block. A terminal block may contain a block of two electrical terminals. A terminal block may also be formed by multiple pairs of terminations. In an analogous manner, termination interfaces may be provided for optical fibers, pipes and conduits that transport gas, fluids and other matter.

Termination interfaces may couple connectors inside a framework with connectors outside the framework.

From the above it is apparent that all calculations that are performed by the automation system 1, and that are described hereinafter with respect to pre-installing electrical wires on electrical control panels, can be also used to aid the pre-installation of water pipes and plumbing units in prefabricated parts of homes or modular homes or to aid the pre-installation of optical fibers in optical telecommunication racks. Such calculations include, but are not limited to, calculations of water pipe lengths or lengths of optical fibers which are used as parameters to control a processing equipment to cut the water pipes and optical fibers in length, to strip or otherwise treat the water pipes or optical fibers on both ends and prints installation instructions on the water pipes or optical fibers.

Also, the below described calculations are used to generate reports with regard to the installation of water pipes or optical fibers in a manner similar to the reports generated with respect to the installation of the electric wires in electrical substations.

The front view diagram 21 includes data such as, but is not limited to, a device ID, a panel ID, a unique equipment type identifier, and device coordinates.

A device ID is a unique identifier assigned to each device, such as a control panel device, that ensures uniqueness at the particular system location. The identifier, however, does not ensure uniqueness of the particular device across multiple system locations.

A panel ID is a unique identifier assigned to each control panel that ensures uniqueness at the particular system location. The identifier, however, does not ensure uniqueness of the particular control panel across multiple system locations.

A unique equipment type identifier is a unique identifier assigned to each control panel device or other system equipment. These identifiers are unique to the control panel device or other system equipment based on the manufacturer and model number across multiple system locations. This identifier is also typically used with procurement systems because it is intended to track the type and model of equipment for procuring and delivery to site instead of tracking a particular device in a particular location.

Device coordinates are (x,y,z) coordinates of a Cartesian Coordinate System associated with a device, such as a control panel device, with respect to the predefined framework, such as the control panel, on which the device is installed. The origin (0,0,0) for the device coordinates are at the lower-left corner of the predefined framework (control panel) containing the device (control panel device).

A common point of origin is calculated for a first and second framework device using a coordinate system that is associated with the first and second framework devices. The coordinate system may be, but is not limited to, a Cartesian coordinate system. Coordinate systems other than a Cartesian coordinate system may also be used to define locations of points of termination of framework devices. For example, it may also be possible to define the locations of points of termination of framework devices based on a polar, cylindrical or spherical coordinate system depending of the design of the framework and the framework devices. Connecting diagrams 22, such as wiring diagrams, define methods of physical wiring by illustrating devices installed in the predefined framework (such as a control panel) and by illustrating how these devices are connected by wires, cables, pipes, optical fibers, conduits and connectors. In particular, a wiring diagram illustrates the beginning and the end terminations of the wires, cables, optical fibers, conduits, or connectors.

When a connector is segmented into a plurality of connector segments and a segment connector length is calculated, distances between first and second x-coordinates and between first and second y-coordinates may be calculated. While these distances may represent distances of a Cartesian coordinate system in an x-direction or in a y-direction of the Cartesian coordinate system, these distances may also be represented by angles or other values of coordinates by which a location or position is defined in the space of the coordinate system.

A wiring diagram 22 includes data such as, but is not limited to, a device ID, a panel ID, a status identifier defining the inclusion of data, wiring termination information, a wire type assignment, a wire tag, terminal block coordinate information, and a field cable placement.

The device ID and the panel ID are used in wiring diagram 22 in a manner analogous to the use of these parameters in the front view diagram 21.

A status identifier defining the inclusion of data is assigned to extracted information which provides an indication of whether the information can be included in system processes or ignored and treated as being pre-existing. For example, the identifier can have the status "Active" or "Historical."

Wiring termination information in wiring diagram 22 defines where each end of each wire or conduit/connector is to be terminated.

Wire-type assignment information defines any overriding features of the wire to be terminated beyond the standard installation. For example, the suffix ** could be added in correlation of a particular wire to indicate that the wire is not to be a standard 14 AWG, grey-insulated wire, but a yellow-insulated 12 AWG wire. This suffix has priority over any database settings associated with the installation of the device.

Terminal block coordinate information is (x,y,z) coordinate information necessary for identifying where each termination of a terminal block exists. The coordinate information is based on the coordinate origin (0,0,0) of the particular wiring diagram containing the terminal block.

There are different types of processes, namely per-drawing processes, full panel evaluation processes and pre-wire processing. The terminal block information is particularly used in a per-drawing processing, such as, for example, the generation of wire tag printer control files. However, for a full panel evaluation type process in the case of the pre-wire processing, the database provides the actual expected locations of each terminal block because such information cannot be accurately obtained from the wiring diagram. It is also possible to use template drawing files that define a location of a termination of a terminal block to improve flexibility and to allow this information to be supplemented in front view diagrams.

A field cable placement is a wire termination location on a particular terminal block for a conductor that is either routed as a single conductor or combined with other conductors in a cable whose other end is located at another piece of equipment external from the control panel or to a terminal block associated with another separate control panel.

Referring to FIG. 1, the Automation Application 50, which is also integrated in the CAD Application 100, includes a system model domain 51, business services 52, an application services 53, data services 54, and configuration services 55. These services and domains are controlled by the main controller 600.

The system model unit 51 creates data objects which represent both the engineering drawing files 20 and the drawing objects defined in the engineering drawings files 20, retrieves extractable information from the engineering drawing files 20, manages drawing object relationships and properties of the drawing objects and calculates connecting point locations and lengths of links between the connecting points of the devices defined in the engineering drawing files 20. The system model domain 51 and the business services 52 provide a program sequence 80 for correlation of the extractable information.

Extractable information is generally data stored in the engineering drawing file which is assigned to particular drawing entities and which is representative of specific physical and process-related properties of the entity. Examples of such information include location information, process status, identifiers of equipment being represented by the entities, etc. The data is stored in the drawings using entity properties and/or data placeholders provided in the drafting (or CAD) software.

The system model domain 51 correlates the retrieved extractable information to the data objects, i.e., the system model domain 51 establishes a relationship between the retrieved extractable information and the data objects of the Automation Application 50. Data objects are objects internally used by the Automation Application 50 to perform the respective calculations.

For example, the system model domain 51 within the exemplary embodiment can have a data object called PanelConductor that has properties that are either populated directly from extracted engineering drawing file data, external sources, or calculated using either or both extracted engineering drawing file data and external source data. Such properties can include the conductor endpoint panel IDs, endpoint device IDs, evaluated circuit type, conductor size, conductor insulation color, conductor insulation type, endpoint conductor strip measurements, routing directions, conductor length, and more. These modeled data objects can also have methods (application actions) that correlate to the represented engineering drawing file entity such as GetCircuitType, GetDeviceType, IsTerminalBlock, and more.

In addition, when the engineering drawing file 20 is modeled by the design processor 40 during the design of an electrical substation, by using an intelligent layer naming convention for the text string representing an entity property of the drawing objects in the engineering drawing file 20, the drawing objects can be correlated. This also results in a correlation of the extractable information retrieved from the engineering drawing file by the System model domain 51.

The application services 53, which are controlled by the main controller 600, perform functional operations such as controlling features of a graphical user interface (GUI) 60, controlling the display of reports of processed information 64 on the display unit 70, and controlling the display of content of help files 14 on the display 70. In particular, the application services 53 define custom window controls, CAD system commands, and initiate the Automation Application 50 by initializing a main window 63, by reading information from application configuration file 13 and by storing the information into accessible properties. The accessible properties are stored in memory 610 during application runtime. Unlike the data objects of the system model domain 51, however, the accessible properties of the application unit 53 relate to application-based information such as the location of the help files, location of data sources, special administrative application process properties that can affect performance of the invention application, and more.

The system model domain 51 data objects require instantiation during application runtime to represent each engineering drawing file entity as each entity is identified. These objects are then correlated with each other only as these relationships are identified. This approach can be described as more of a modeling approach. Thereby, the automation application 50 is temporarily configured to establish the correlation. Unlike this modeling approach in the system model domain 51, the accessible properties stored by the application services 53 that are retrieved from the application configuration file 13 are designed to be accessed at anytime during application runtime by any object needing to retrieve the described information without concerns of object relationships. This can be described as more of a data store approach instead of a modeling approach for configurable information.

The business services 52 define process options available for selection by a user and manages file generation processes for specified file types. More specifically, the business services 52 manage process stages and requirements to process the extractable information retrieved from the engineering drawing files 20 by the system model domain 51 based on user-selectable processing options selected by a user in a process options selection dialog window 61. In addition, the business services 52 define business logic for the selectable process options and manages file generation processes for specified file types such as report files 12 and equipment control files 15. The equipment control files 15 generated by the business services 52 are transmitted to the file converter 200, to the engraver controller 400, and to the wire tag printer controller 500. The file converter 200 converts the equipment control files 15 into converted wire processing equipment control files 17 which are sent to the connector processing equipment controller 300.

An equipment control file 15 is generally an electronic file of a format appropriate for a specific piece of equipment and its controlling software that contains data used to control the particular piece of equipment. For example, the control software for a wire tag printer allows the importing of a file containing information to be placed on a group of wire tags.

Specifically, an equipment control file 15, which is transmitted to the file converter 200, is a connector processing equipment control file 19. Equipment control files 15, which are transmitted to the engraver controller 400 and to the connector tag printer 500 are engraver control files 16 and connector tag printer control files 18, respectively. Engraver control files 16, converted connector processing equipment control files 17, and connector tag printer control files 18 are generated in a format which is appropriate for use with the respective processing equipment so that it can be interpreted by the connector processing equipment controller 300, the engraver controller 400, and the connector tag printer controller 500 to control the operation of the wire processing equipment 700, the engraver 800 and the connector tag printer 900, respectively.

While the connector processing equipment 700, the engraver 800, and the connector tag printer 900 are examples for processing equipment controlled by the equipment control files 15, the invention is not limited to these devices. Instead, any type of processing equipment can be integrated in the automation system 1, as long as it can be controlled by equipment control data.

An exemplary embodiment of the inventive concept is a wire processing equipment 700 which is controlled to cut a wire to a length, to print information on the wire, and to strip both ends of the wire. The information printed on the wire includes, but is not limited to, a lug size, a lug type, a wire tag, a destination, a source, and routing information.

A lug is a terminal (or connector) that is attached to the end of a wire whose specific design is intended for a specific type of device termination. A lug size is a size of the electrical connector to be applied at the end of a wire that indicates both the wire size the electrical connector was designed for and the screw size it was designed around when terminating.

A lug type is a type of electrical connector to be applied at the end of a wire whose design is based on the desired method of termination. For example, a ring lug (or alternatively ring terminal) ensures the terminating wire cannot be removed without the terminating screw being removed first or a pin-style lug (or alternatively pin terminal) allows a wire to be terminated onto a pin-type termination instead of a screw-type termination.

Routing information is information providing the wire routing decisions of Automation Application 50 per each end of each wire. Such information on one end of a wire may state the decision factors "Above" and "Right" which instruct the installing electrician that the wire end leaves the termination and is routed to some point vertically above the device and is routed toward the right-side panel boundary. The other end of the wire could state the factors "Below" and "Right" indicating that the wire is routed to a point vertically below the device then routed to the right-side panel boundary.

The business services 52 further performs process evaluation of physical wiring and generates report data which is stored in report files 12 or which is transmitted to the application unit 53 as displayable report data. Process evaluation of physical wiring may include only panel-side terminations, only field-side terminations, or both panel-side terminations and field side terminations.

A report is information processed that can be either presented in graphical user interface 60 on display unit 70 or that can be presented in a file of an appropriate format as generated by the Automation Application 50. Report files 12, as shown in FIG. 2, are electronic files of an appropriate format containing processed information in a presentable manner. A termination count report contains information about a number of terminations per framework for a field-side connection and/or a framework-side connection. Filed-side connections are connections that connect a connector from outside the framework. Framework-side connections are connections that connect a connector from inside or internal to the framework.

The business services 52 generates the termination count reports that can be stored in termination count report files 121, compatibility reports, summary conductor reports, and detailed conductor reports. However, these reports are only given by way of example.

When a termination count report is stored in a termination count report file 121, calculation equations are built into the report file which allow a user to track wiring installation performance.

Compatibility reports contain information indicating and describing data errors of drawing objects in the engineering drawing files 20 and/or physical wiring errors. The compatibility reports can be stored in compatibility report files 122.

Summary conductor reports contain information summarizing wire routing decisions made during wire length calculations. The information about the routing decisions is provided as an easy-to-read guide for electricians or other personnel involved in the process of installing control panel wiring. Summary conductor reports can be stored in summary conductor report files 123.

Detailed conductor reports contain detailed information regarding wire routing decisions made during the wire length calculations and are used as a guide for technical support personnel to assist the technical support personnel to determine why an outcome of a wire length calculation was not as expected. Detail conductor reports can be stored in detail conductor report files 124.

The business services 52 also generate report data which is only displayed on the display unit 70 without generating a report file, an example of which is a report providing a total number of terminations. The report data of a total number of terminations report is only displayed on the display unit 70 and is not stored in a report file 12.

FIG. 2 is a block diagram illustrating data transmitted from and received by the Automation Application 50 that contains a graphical user interface (GUI) 60 of the automation system according to the exemplary embodiment of the present invention.

Referring to FIG. 2, a graphical user interface (GUI) 60 provides a main window 63 in which reports of processed information 64 can be displayed, a process options selection dialog window 61 and an advanced settings dialog window 62.

Output files, such as report files 12 and equipment control files 15, predefines template files 11, engineering drawing files 20, application configuration files 13, help files 14 and database 30 may be stored in memory 30. Report files can be printed on a printer (not shown). The equipment control files 15 are transmitted via a computer network such as, for example, via an Ethernet, by using the communications controller 90, to the file converter 200, the engraver controller 400, or the wire tag printer controller 500, respectively, to control the wire processing equipment 700, the engraver 800, and the wire tag printer 900, respectively.

Processing Extractable Information

FIGS. 3A-3G are views illustrating a plurality of possible wiring scenarios. FIG. 4 is a flowchart explaining the processing of information extractable from an engineering drawing file.

Referring to FIG. 4, objects in an engineering drawing file 20, such as for example a wiring diagram 22 or a front view diagram 21, are modeled to provide extractable information (S401). Each of the drawing objects corresponds to a component or device, such as control panel devices 302 or connectors 304, depicted in FIG. 3A, which are defined in the engineering drawing file 20 and which are installed on the control panel 301.

Drawing objects which correspond to components or devices installed on the control panel 301 contain data representing and describing characteristics of the control panel components or control panel devices, such as control panel devices 302 or 303. More specifically, drawing objects are engineering drawing file entities representing the characteristics and construction/installation requirements for at least one device. For example, a drawing file may contain an entity representing the dimensions and location of a particular device mounted on a control panel whose use is intended for the protection and control of an electric system and another drawing file may contain information regarding the installation of wiring for that particular device.

In addition to the modeling of the engineering drawing file 20 (S401), a program sequence 80 is provided to establish a correlation of the extractable information (S401). In addition, other extractable information, such as support information 35 and application process settings data 13, may already be added to the engineering drawing during modeling of the engineering drawing file 20. The extractable information relates to connecting points of the device(s), such as first termination 308 and second termination 309 in FIG. 3E, and to links or connections represented by a connector 309 between the connecting points of the control panel component(s) or control panel device(s) for which drawing objects are defined in the engineering drawing file 20. The extractable information may be added as an entity property of the drawing object in the format of a text string. The format may include an intelligent layer naming convention in which the format of each text string of each data object is defined.

In general, a connecting point of a control panel component or control panel device may be any point of termination on the particular device connecting it to a particular system. For example, the connecting point on an electrical device would be used for termination of a wire on that particular device in support of protection and/or control of a particular electric system.

A program sequence 80 is provided (S402) and extractable information is correlated by using the program sequence 80 of the Automation Application 50 (S403). The data objects are created by the system model domain 51 and represent the engineering drawing file 20 itself and the drawing objects in the engineering drawing file 20.

After correlating the extractable information, the extractable information is processed based on user-selectable processing options provided by a graphical user interface 60 in a process options selection dialog window 61 and output data 12, 15 is generated based on the established correlation (S404).

User-selectable processing options are options the end-user may select from the graphical user interface 60 that each represents an independent process to display specific information, generate reports, or generate files used to control other process equipment.

Based on the selected processing option, an equipment control file 15 or a report are generated (S404). The report may be stored in a report file 12 or may be displayed on a display 70.

Calculation of Wire Length

Figure 5A:
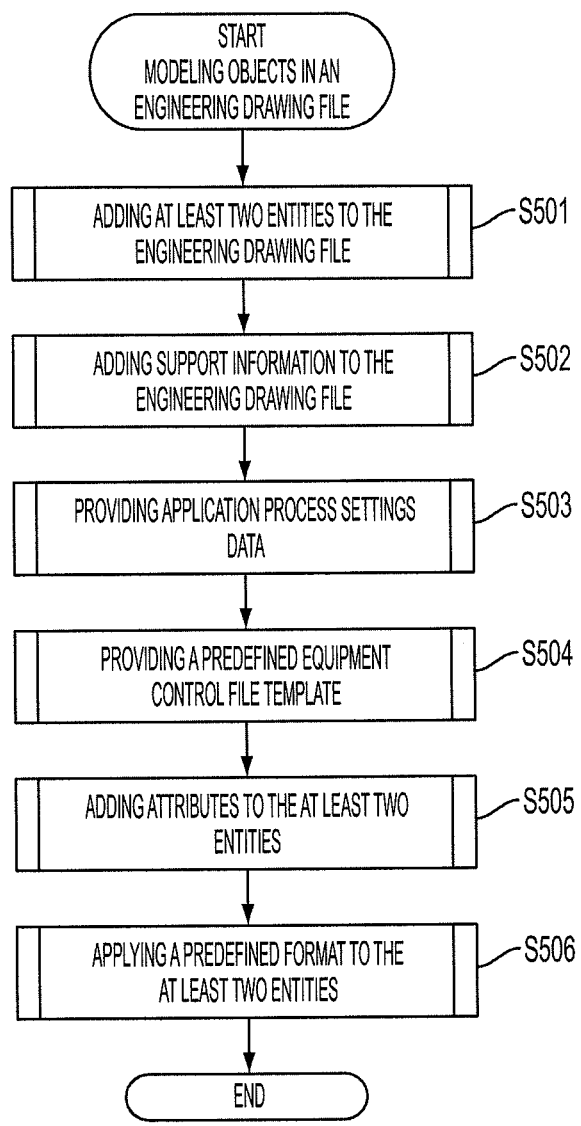
FIG. 5A is a flowchart explaining the modeling of objects in an engineering drawing file.
Figure 5B:
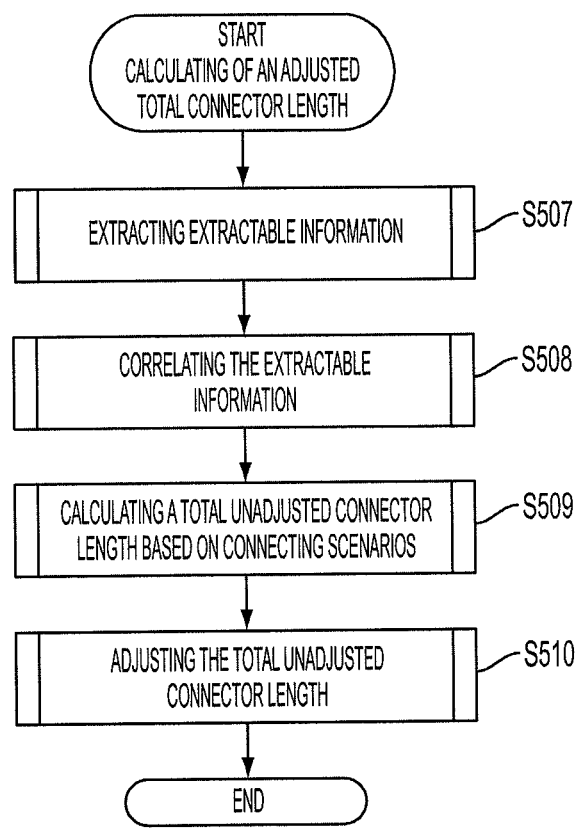
FIG. 5B is a flowchart explaining the calculation of an adjusted total connector length.

FIG. 5A is a flowchart explaining the modeling of objects in an engineering drawing file. FIG. 5B is a flowchart explaining the calculation of an adjusted total connector length.

Referring to FIG. 5A, the modeling of objects in the engineering drawing file 20 includes the operations of adding at least two entities to the engineering drawing file (S501), adding support information 35 to the engineering drawing file 20 (S502), providing application process settings data (S503), providing a predefined equipment control file template (S504), adding attributes to the at least two entities (S505) and applying a predefined format to the at least two entities (S506).

Referring to FIG. 5B, the calculation of the wire length includes extracting the extractable information (S507), correlating the extractable information (S508), calculating a total unadjusted connector (wire) length based on at least one of a plurality of wiring scenarios (S509), and adjusting the total unadjusted wire length (S510).

A segment wire length is a portion of the total wire whose length is derived independently from other portions of the same wire. To ensure greater control of wire routing and wire length calculation decisions at various points along the wire, each wire is divided into segments.

Figure 3A:
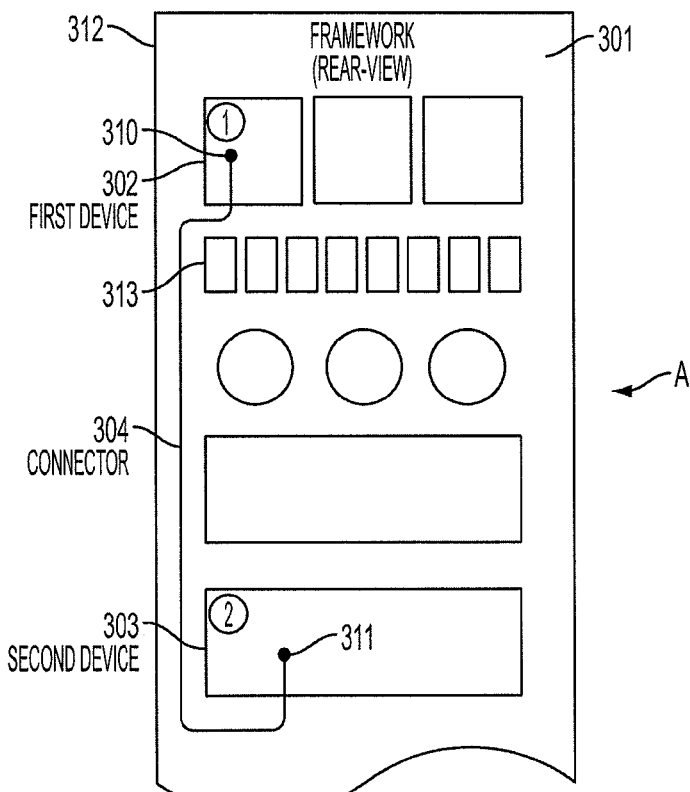
FIG. 3A is a view illustrating a wiring scenario in which a wire is routed around control panel devices located above or below each other and along a panel boundary.

Examples of wiring scenarios are illustrated in FIGS. 3A-3G. In particular, FIG. 3A is a view illustrating a wiring scenario in which a wire is routed around control panel devices located above or below each other and along a panel boundary.

Referring to FIG. 3A, a first control device 302 is installed in the upper part of the control panel 301 above control device 313 and also above a second control device 303 which is installed in the lower part of the control panel 301, i.e., below the first control device 302. A wire 304 connects a first termination 310 of the first control device 302 with a second termination 311 of the second control device 303. The wire 304 is routed around a control panel device 313, which is below the first control panel device 302, along panel boundary 312 of the control panel 301.

Figure 3B:
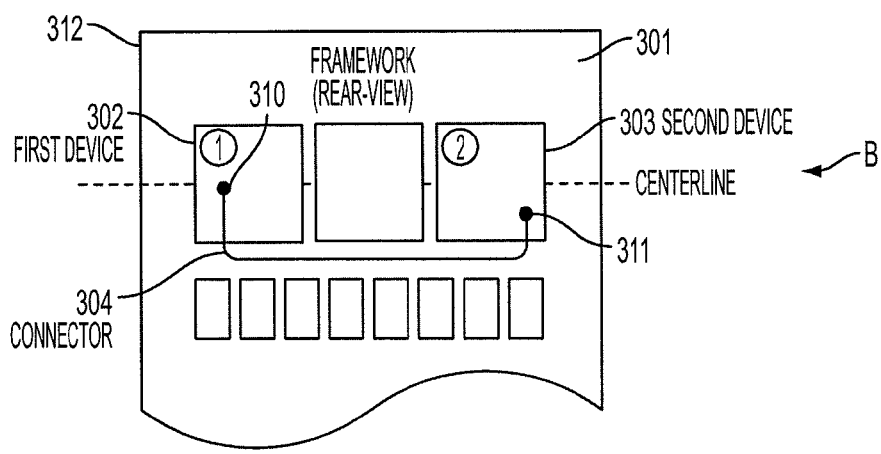
FIG. 3B is a view illustrating a wiring scenario in which a wire is routed around control panel devices located side-by-side.
Figure 4:
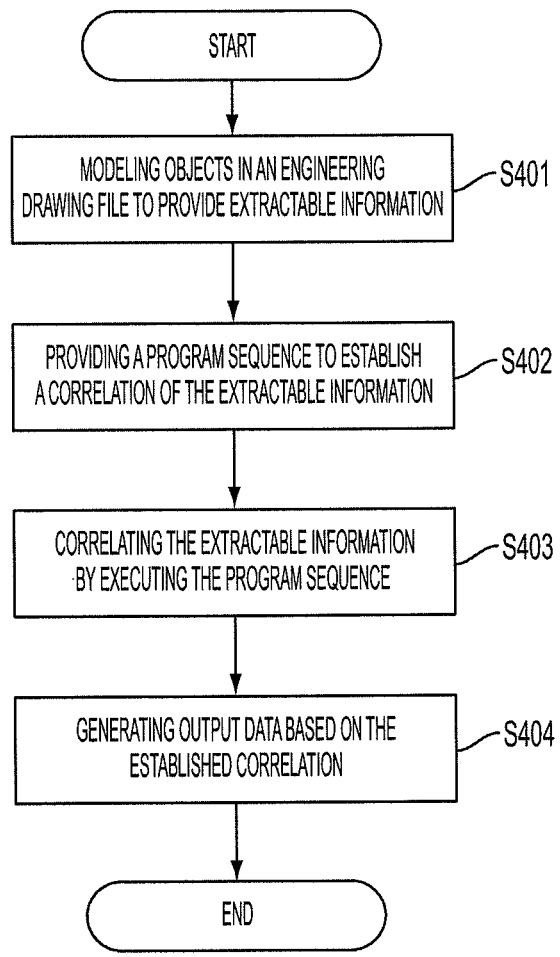
FIG. 4 is a flowchart explaining the processing of information extractable from an engineering drawing file.

FIG. 3B is a view illustrating a wiring scenario in which a wire is routed around control panel devices located side-by-side.

FIG. 3B shows a first control device 302 and a second control device 303. The control devices in FIG. 3B are arranged side-by-side. A wire 304 is routed around the first control device 302 and the second control device 303 to connect a first termination 310 of the first control device 302 with a second termination 311 of the second control device 303.

Figure 3C:
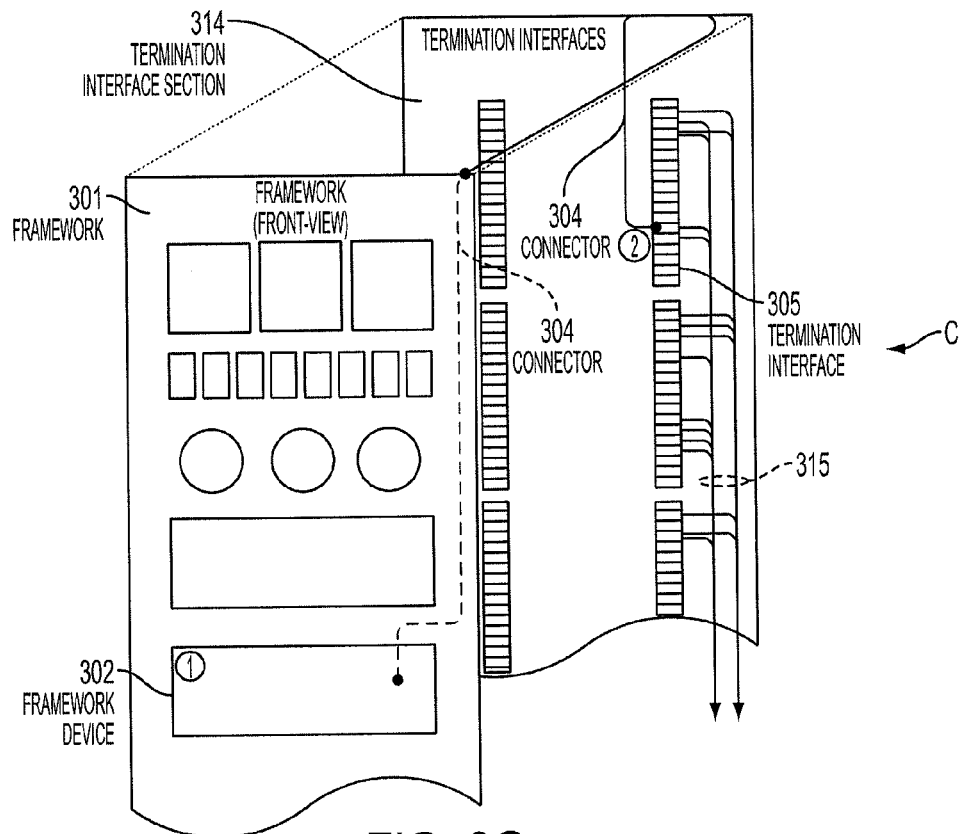
FIG. 3C is a view illustrating a wiring scenario in which a wire is routed from a control panel device to a terminal block.

FIG. 3C is a view illustrating a wiring scenario in which a wire is routed from a control panel device to a terminal block.

Referring to FIG. 3C, a control panel 301 is shown on which a first control panel device 302 is installed. A terminal block section 314 is provided behind the control panel 301. In the exemplary embodiment, a plurality of control panels may be provided and each of the plurality of control panels is provided with a corresponding terminal block section. Wires are routed from the control panel 301 to the terminal block section 314. In particular, wire 304 is routed from control panel device 302 to terminal block 305, which is installed on terminal block section 314.

Each control panel is associated with terminal blocks as the terminal blocks serve as an interfacing point for the control panel in the control system. However, the organization, configuration, and location of these terminal blocks can be different depending upon the applied scenario to meet the flexible requirements necessary in the control system. For example, a station developed with standard X may have terminal blocks located on a neighboring panel, a station designed with standard Y may have terminal blocks arranged on a wall with a different organization, and even still yet a station designed with standard Z may have terminal blocks mounted on brackets hovering behind the control panel to which the terminal blocks apply.

As FIG. 3C further shows, other wires, such as wires 315, that may be bundled in cables, are routed from the terminal blocks of terminal block section 314 to field equipment, i.e., equipment outside the control house in which the control panels are installed. In addition, wires may be routed from terminal blocks of terminal block section 314 to another control panel.

Figure 3D:
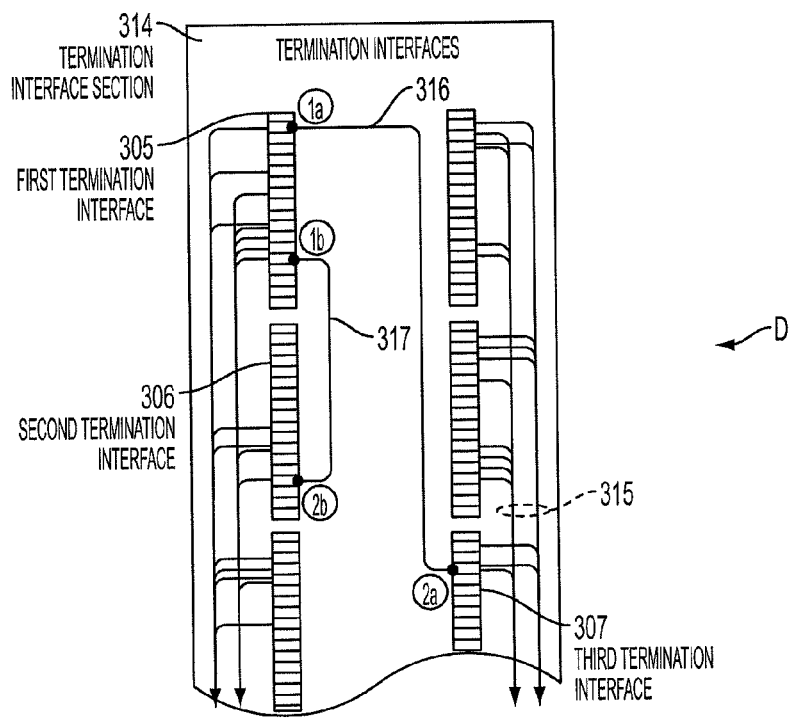
FIG. 3D is a view illustrating a wiring scenario in which a wire is routed from a first terminal block to a second terminal block.

FIG. 3D is a view illustrating a wiring scenario in which a wire is routed from a first terminal block to a second terminal block.

FIG. 3D shows a plurality of terminal blocks installed on terminal block section 314. Wire 317 is routed from a first terminal block 305 on the terminal block section 314 to second terminal block 306 of terminal block section 314, whereas terminal blocks 305 and 306 are terminal blocks of a same side of terminal block section 314. In addition, wire 316 is routed from the first terminal block 305 to the third terminal block 307. Terminal blocks 305 and 307 are terminal blocks of different sides of the terminal block section 314.

Similar to FIG. 3C, FIG. 3D shows other wires which may be routed to equipment outside the control house or to other control panels.

Figure 3E:
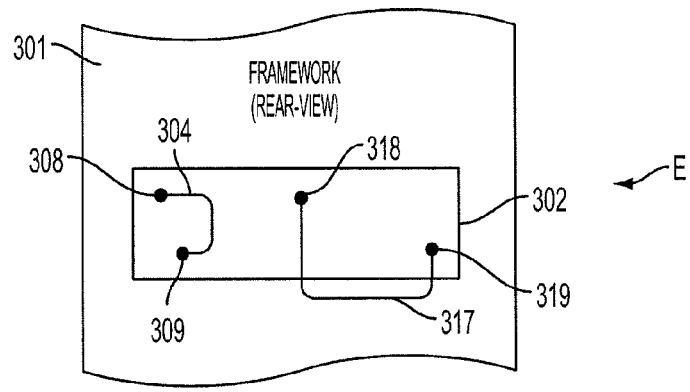
FIG. 3E is a view illustrating a wiring scenario in which a wire is routed from a first termination of a single control panel device to a second termination of the single control panel device.

FIG. 3E is a view illustrating a wiring scenario in which a wire is routed from a first termination of a single control panel device to a second termination of the single control panel device.

FIG. 3E shows a single control device 302 which is installed on control panel 301. Each of the wires 304 and 317 connect two terminations of the single control device 302. Wire 304 is directly routed from termination 308 to termination 309. Wire 317 is routed around the single control device 302 from termination 318 to termination 319.

When a wire, such as wire 304 in FIG. 3E connects two terminations of a single control device without being routed around another control device, the wire is also called a jumper. There are two options to calculate the wire length of a jumper. A user may choose whether a fixed length should be applied or whether the wire length should be calculated.

If a fixed wire length is applied, the predetermined jumper length is used regardless of the wire length that is actually necessary for a particular device and two particular terminations.

If the wire length of the jumper is calculated based on the wiring scenario illustrated in FIG. 3E (jumper calculation), the calculation slightly differs from the general calculation of the wire length of the flowchart depicted in FIG. 5. For example, the jumper calculation does not involve segmented evaluations and calculations. Instead, the calculation may be based on two approaches. In a first approach, a Jumper Termination Tolerance (JTT) is defined as a tolerance that is used to compare device termination positions between two points on the same device. Based on the JTT, it is determined whether a direct route between two terminations on the same device can be accomplished due to lack of termination barriers on the device or if the jumper should be routed around the device externally. As second approach is based on a Termination Leave Direction (TLD) which is a setting that defines whether a device termination is designed for wiring in a specific direction.

Figure 3F:
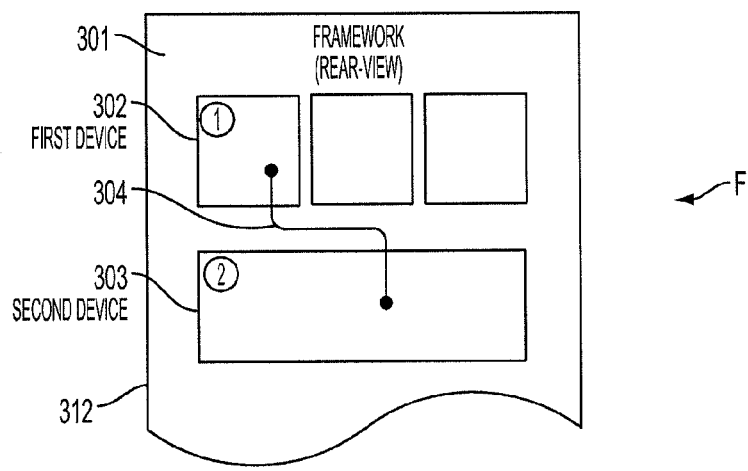
FIG. 3F is a view illustrating a wiring scenario in which a wire is routed from a first control panel device to a second control panel device, the first control panel device being located above or below the second control panel device, without routing the wire around the first and second control panel devices and without routing the wire along the panel boundary.

FIG. 3F is a view illustrating a wiring scenario in which a wire is routed from a first control panel device to a second control panel device, the first control panel device being located above or below the second control panel device, without routing the wire around the first and second control panel devices and without routing the wire along the panel boundary.

Referring to FIG. 3F, a first control panel device 302 is installed above a second control device 303 on control panel 301. Wire 304 is directly routed from the first control device 302 to the second control device 303, i.e., it is not routed around any of the control devices installed on control panel 301, and it is not routed along a panel boundary 312.

This scenario is similar to the scenario shown in FIG. 3E in which a jumper connects two terminations of the same device.

Figure 3G:
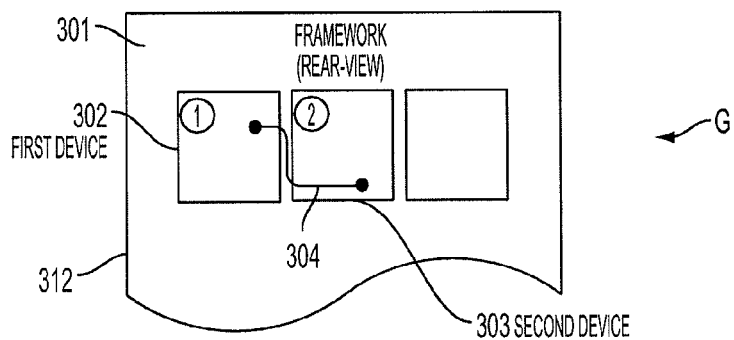
FIG. 3G is a view illustrating a wiring scenario in which a wire is routed from a first control panel device to a second control panel device, the first and the second control panel device being located side-by-side, without routing the wire around the first and second control panel devices and without routing the wire along the panel boundary.

FIG. 3G is a view illustrating a wiring scenario in which a wire is routed from a first control panel device to a second control panel device, the first and the second control panel device being located side-by-side, without routing the wire around the first and second control panel devices and without routing the wire along the panel boundary 312.

Referring to FIG. 3G, a first control device 302 and a second control device 303 are shown which are arranged side-by-side. Wire 304 is directly routed from the first control device 302 to the second control device 303, i.e., it is not routed around any of the control devices installed on control panel 301, and it is not routed along a panel boundary 312.

Figure 6A:
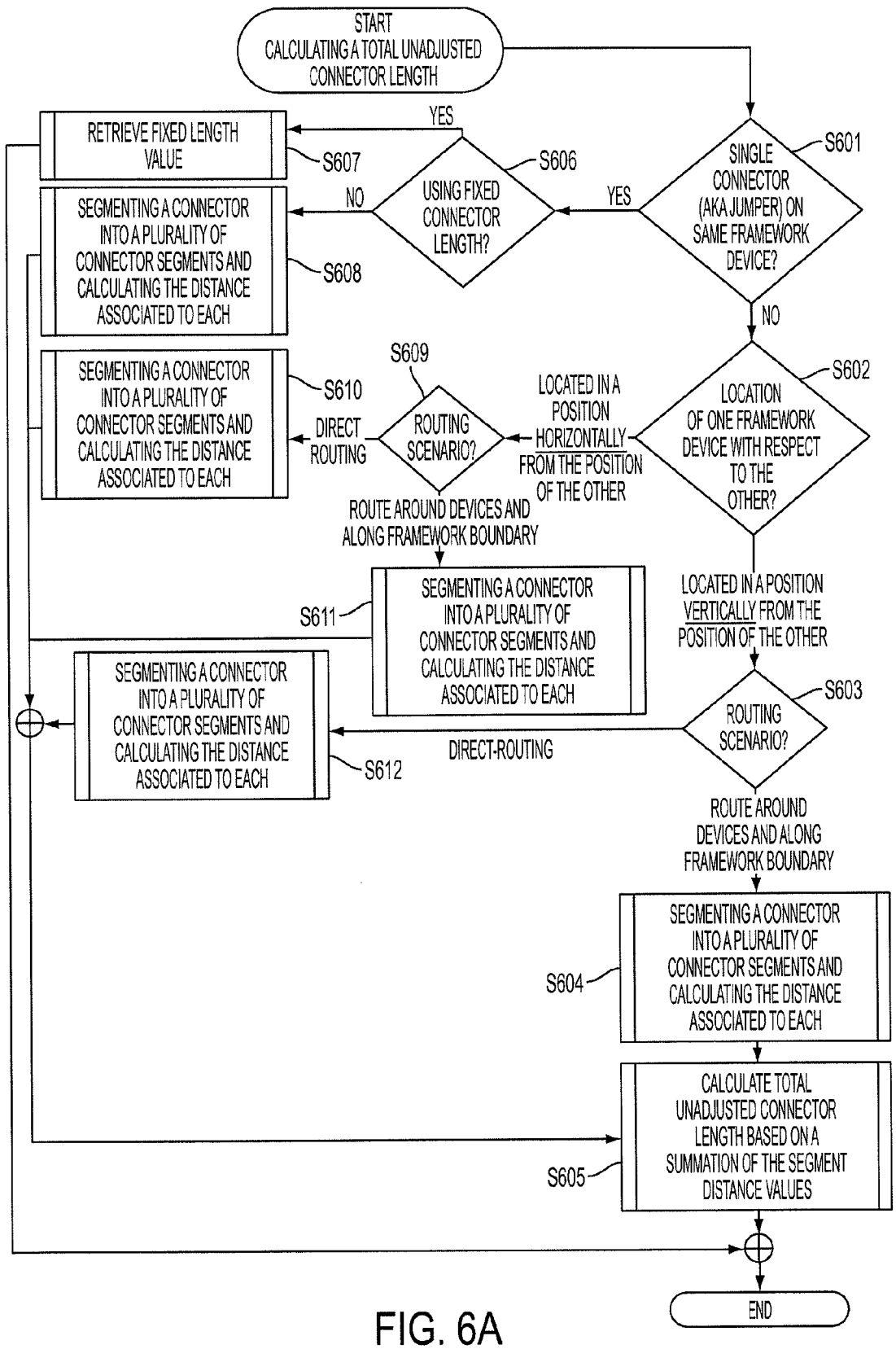
FIG. 6A is a flowchart explaining the calculation of a total unadjusted connector length.

FIG. 6A is a flowchart explaining the calculation of a total unadjusted connector (wire).

Referring to FIG. 6A, the main controller 600 determines whether the wire is a single wire on a same control device (S601). If the wire is a single wire, the main controller 600 determines whether a fixed wire length is used (S606). If a fixed wire length is used, the main controller 600 retrieves a fixed wire length value and sets the retrieved fixed wire length value as the total unadjusted wire length for the wire, (S607). The fixed wire length may be stored in the engineering drawing file 20 or in a separate database (not shown).

If a fixed wire length is not used, the main controller 600 segments the wire into a plurality of wire segments, calculates a segment wire length for each of the plurality of wire segments S608, and calculates the total unadjusted wire length based on a summation of segment wire lengths of each of the plurality of wire segments (S605). Since the operation of segmenting the wire into wire segments and calculating segment wire length based on a plurality of wiring scenarios and a plurality of different rules and methods for calculating the total unadjusted wire length, and since the operation involves complex and repeated evaluations of intermediate calculation results, the summation of the plurality of segment wire lengths is also referred to as a complex summation of segment distance values.

Figure 6B:
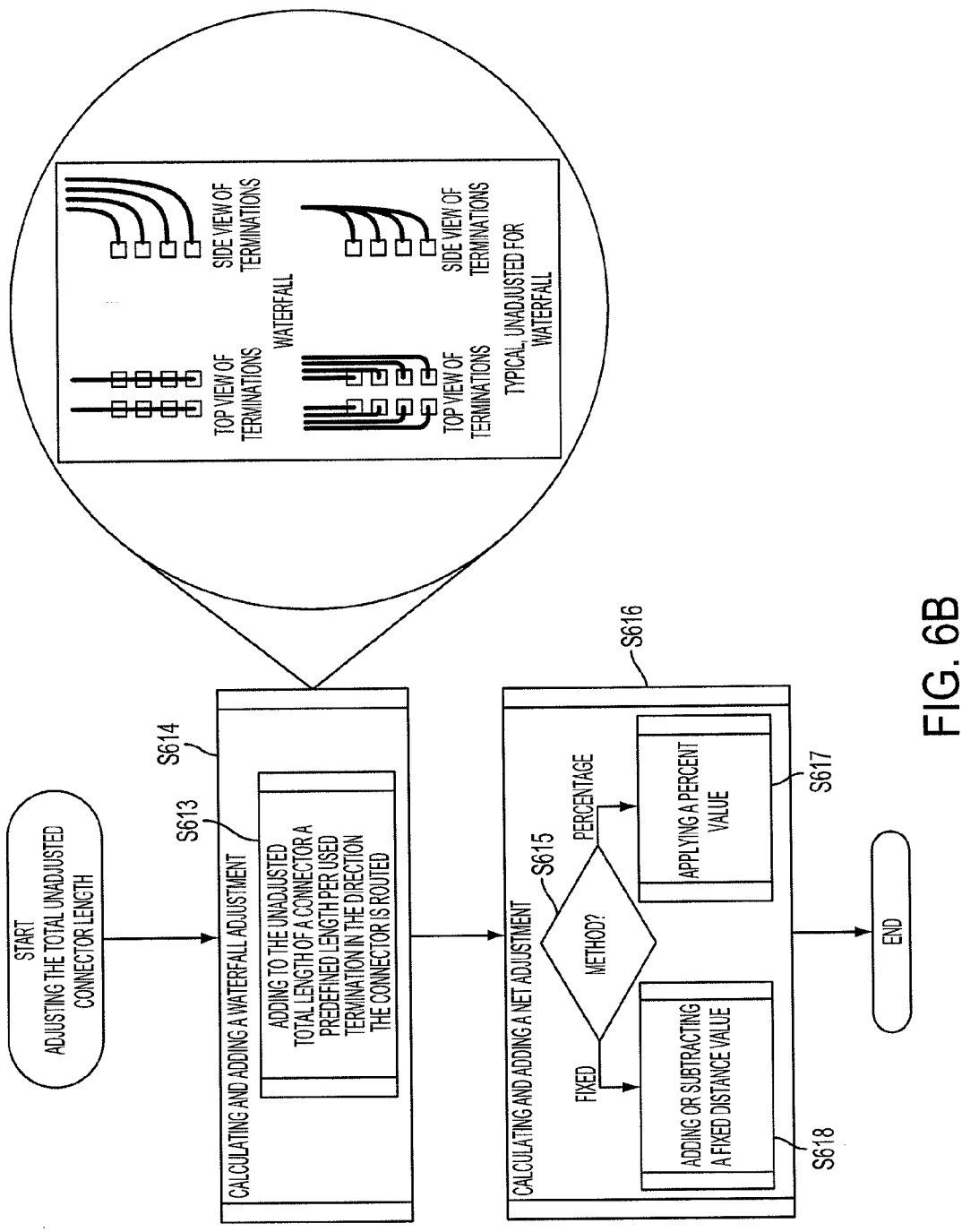
FIG. 6B is a flowchart explaining the adjusting of the total unadjusted connector length.
Figure 6C:
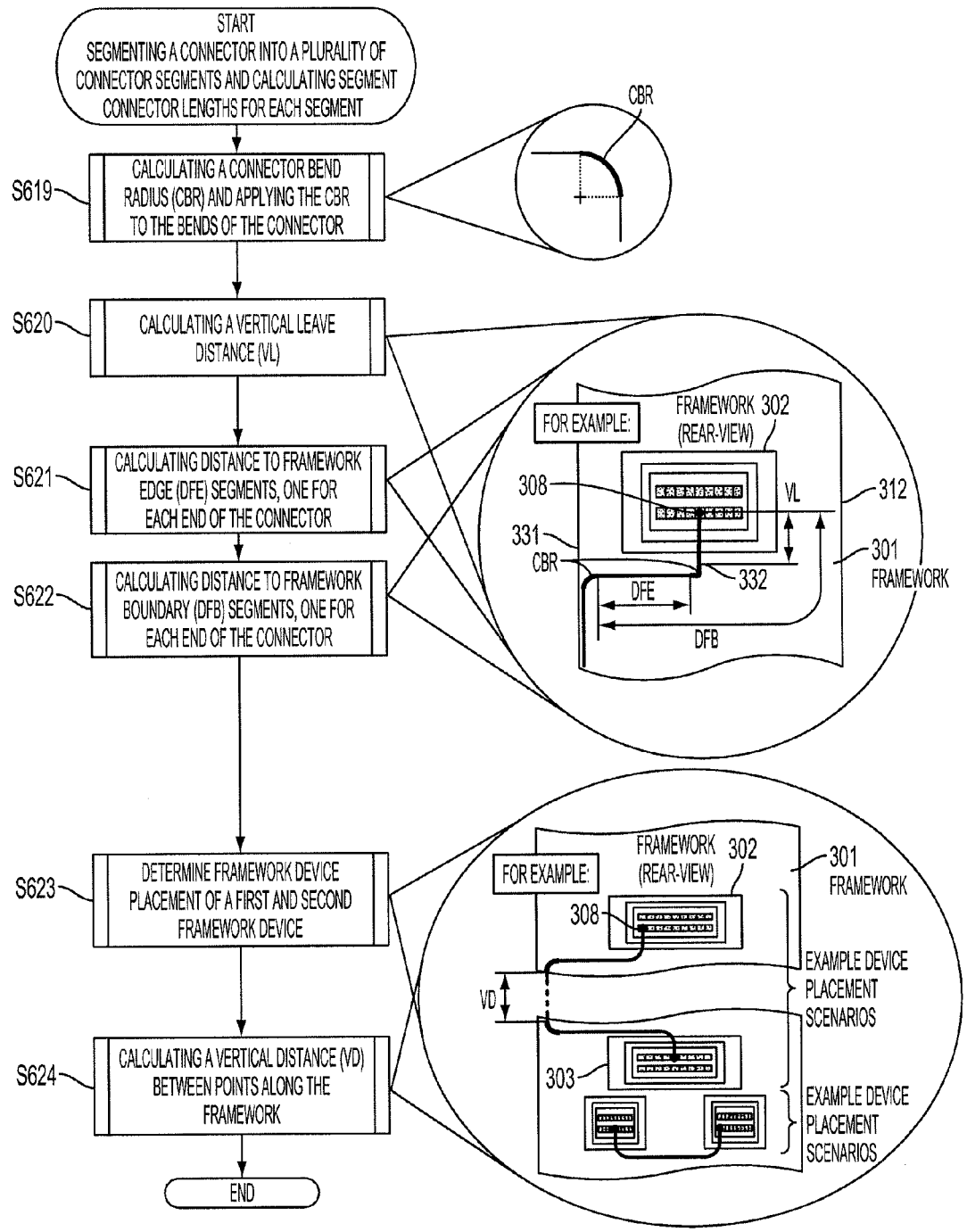
FIG. 6C is a flowchart explaining the segmenting of a connector into a plurality of connector segments and the calculation of the connector lengths for each segment for a connector installed between two framework devices which are located in positions vertically from each other when the wire is routed around the framework devices.
Figure 6D:
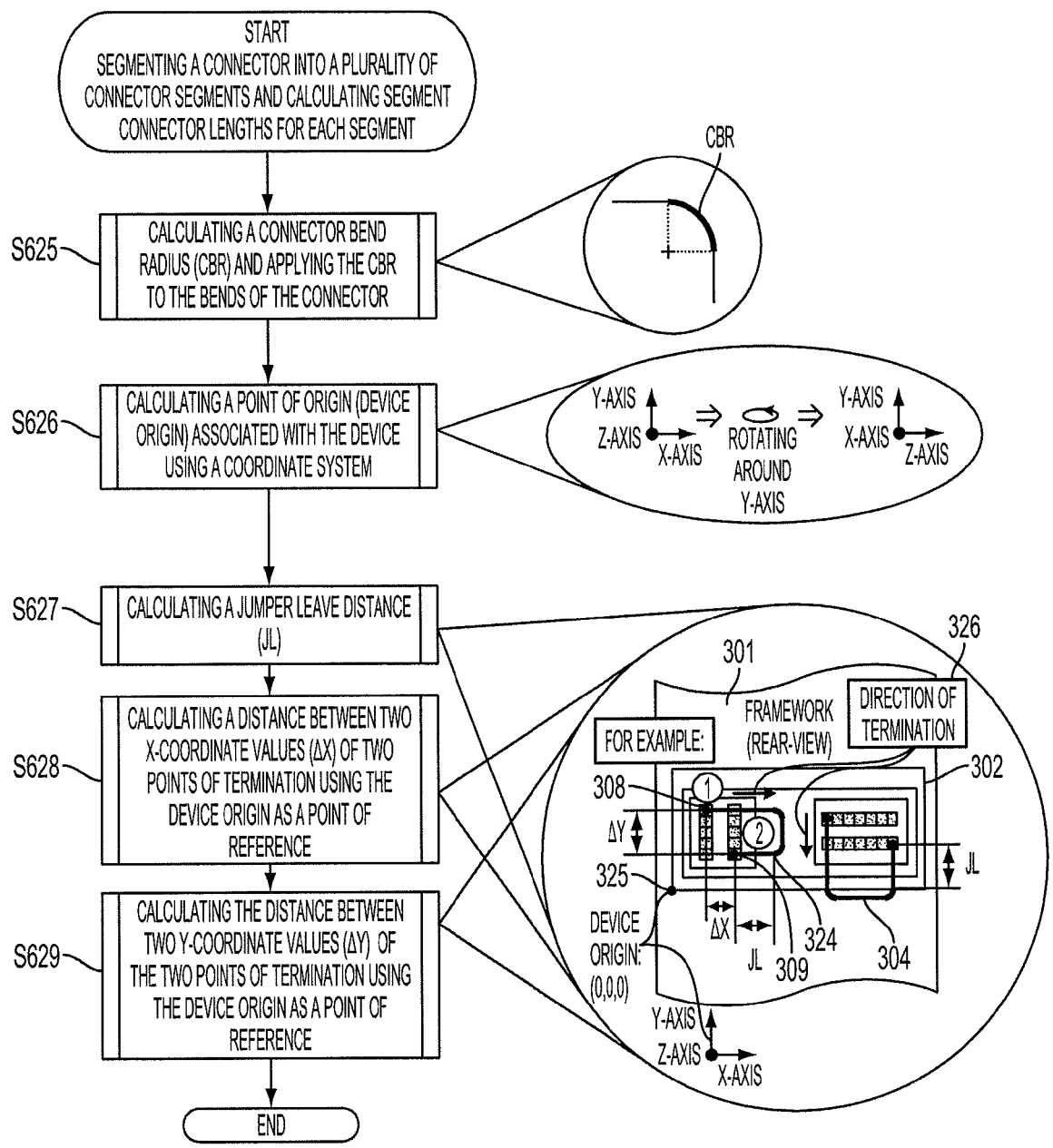
FIG. 6D is a flowchart explaining the segmenting of a connector into a plurality of connector segments and the calculation of the connector lengths for each segment for a connector installed between terminations of a single framework device.

FIG. 6D is a flowchart explaining the segmenting of a connector (wire) into a plurality of wire segments and the calculation of the connector lengths for each segment for a connector installed between terminations (terminals) of a single framework (control panel) device. When the total unadjusted wire length of a single wire on a same control panel device is calculated and a fixed wire length is not used, the main controller 600 calculates a connector bend radius (CBR) for each bend in the wire (S625), a point of origin 325 associated with the control panel device 302 using a coordinate system (S626), a jumper leave distance (JL) (S627); a distance ΔX between a first x-coordinate value of a first point of termination 308 of the control panel device and a second x-coordinate value of a second point of termination 309 of the control panel device based on the point of origin 325 (S628), and a distance ΔY between a first y-coordinate value of the first point of termination 308 of the at least one device and a second y-coordinate value of the second point of termination 309 of the control panel device based on the point of origin 325 (S629).

A jumper leave distance may be calculated when a connector crosses multiple terminations of a framework device to which the connector is not connected before being routed to a different framework device or when the connector is attached to two terminations of a single framework device and crosses at least one other termination of the framework device. A jumper leave distance defines a distance between a point of termination and a point on the connector at a distance from the point of termination in a certain direction of termination. The direction of termination is a direction in which the connector comes off the termination, i.e., a direction that leads away from the termination. The direction is defined based on the coordinate system which is applied to the framework device. From the point on the connector at the distance from the point of termination, the connector may be bent in a direction that is different from the direction of termination. The jumper leave distance (JL) in FIG. 6D is defined as a distance between the second point of termination 309 on the control panel device 302 and a point 324 extending in a direction of termination 326.

If the wire is a not a single wire (S601), the main controller 600 determines a location of a first control panel device 302 and a second control panel device 303 relative to each other (S602) and a routing scenario depending on whether the first and second control panel devices are located horizontally or vertically to each other (S609) and (S603).

When the main controller 600 determines that the first and the second control panel devices are located horizontally to each other and a direct routing scenario is applied (S609), the main controller 600 segments the wire into a plurality of wire segments and calculates a segment wire length for each of the plurality of wire segments (S610) and a total unadjusted wire length based on a summation of the segment wire length of each of the plurality of wire segments (S605).

Figure 6E:
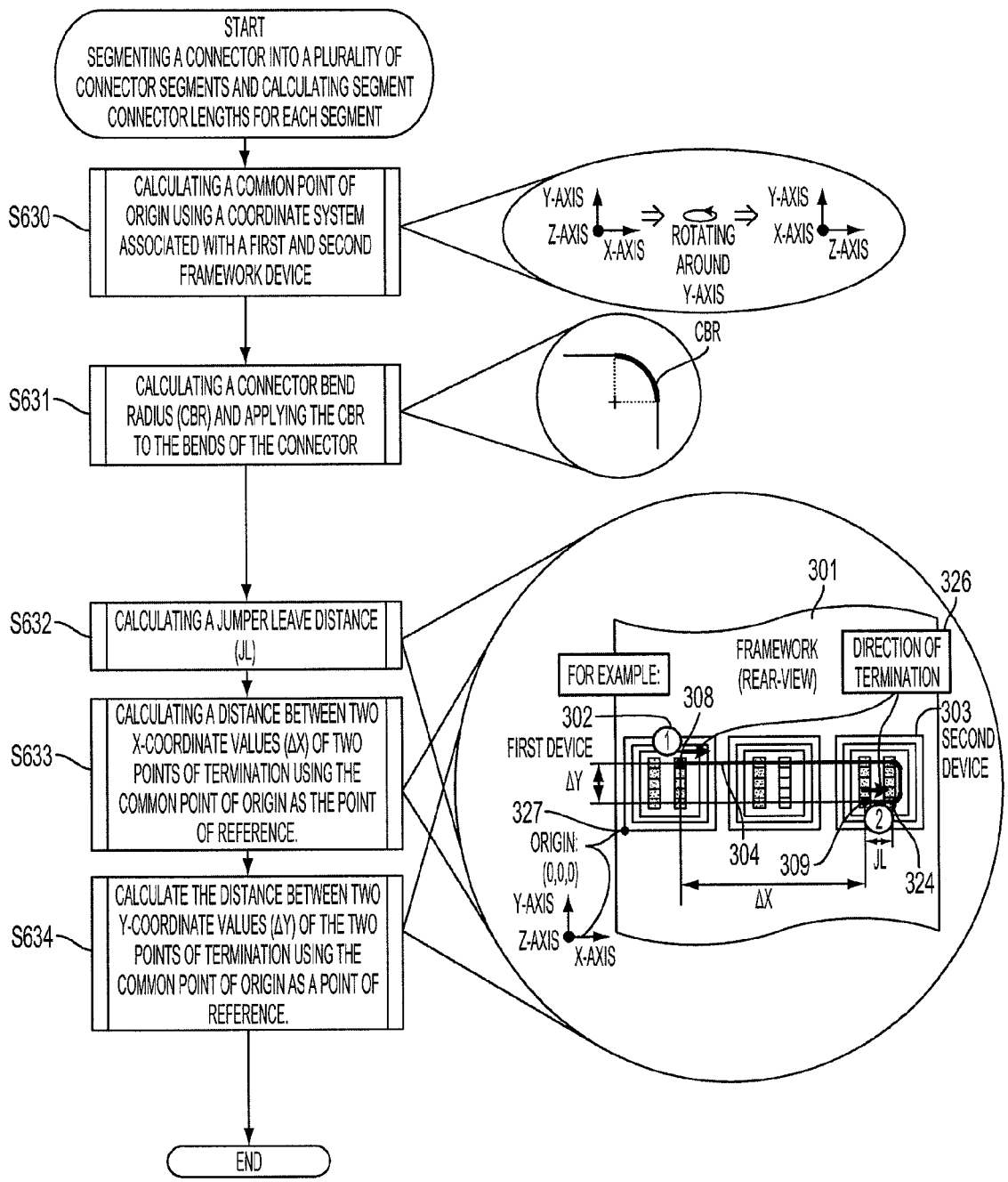
FIG. 6E is a flowchart explaining the segmenting of a connector into a plurality of connector segments and the calculation of the connector lengths for each segment for a connector installed between two framework devices which are located in positions horizontally from each other when the connector is directly routed between the framework devices.

FIG. 6E is a flowchart explaining the segmenting of a connector (wire) into a plurality of connector segments and the calculation of the connector lengths for each segment for a connector installed between two framework (control panel) devices which are located in positions horizontally from each other when the connector is directly routed between the framework devices.

To calculate the segment wire lengths for each of the plurality of wire segments when two control panel devices are horizontally located to each other and when the wire is directly routed between the control panel devices, the main controller 600 calculates a common point of origin 327 for the first control panel device 302 and the second control panel device 303 using a coordinate system (S630), a connector bend radius (CBR) for each bend in the wire (S631), a jumper leave distance (JL) (S632), a distance ΔX between a first x-coordinate value of a first point of termination 308 of the first control panel device 302 and a second x-coordinate value of a second point of termination 309 of the second control panel device 303 based on the common point of origin 327 (S633), a distance ΔY between a first y-coordinate value of the first point of termination 308 of the first control panel device 302 and a second y-coordinate value of the second point of termination 309 of the second control panel device 303 based on the common point of origin 327 (S634).

The common point of origin 327 includes an x-axis, an y-axis, and a z-axis value, the jumper leave distance (JL) is defined as a distance between the second point of termination 309 on the second control panel device 303 and a point 324 extending in a direction of termination 326. The connector bend radius (CBR) defines a length of a bend of the wire.

When the main controller 600 determines that the first and the second control panel devices are located horizontally to each other and a routing scenario around devices and along panel boundaries is applied (S609), the main controller 600 segments the wire into a plurality of wire segments and calculates a segment wire length for each of the plurality of wire segments (S611) and a total unadjusted wire length based on a summation of the segment wire length of each of the plurality of wire segments (S605).

Figure 6F:
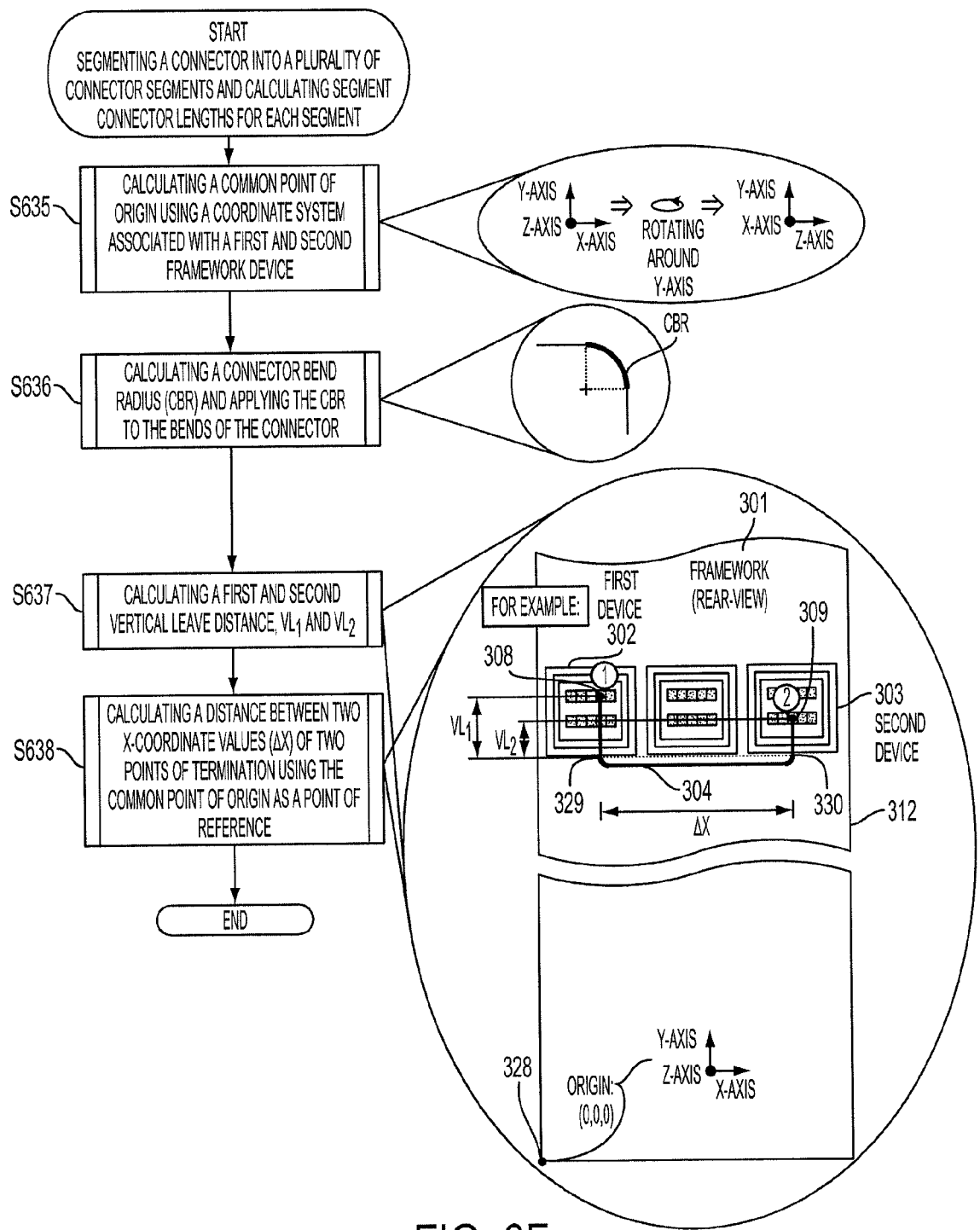
FIG. 6F is a flowchart explaining the segmenting of a connector into a plurality of connector segments and the calculation of the connector lengths for each segment for a connector installed between two framework devices which are located in positions horizontally from each other when the connector is routed around the framework devices.

FIG. 6F is a flowchart explaining the segmenting of a connector (wire) into a plurality of connector segments and the calculation of the connector lengths for each segment for a connector installed between two framework (control panel) devices which are located in positions horizontally from each other when the connector is routed around the framework devices.

To calculate the segment wire lengths for each of the plurality of wire segments when two control panel devices are horizontally located to each other and when the wire is routed around the control panel devices, the main controller 600 calculates a common point of origin 328 for the control panel 301 using a Cartesian coordinate system (S635), a connector bend radius (CBR) for each bend in the wire (S636), a vertical leave distance (VL) for each of the wire ends (S637), a distance $\Delta X$ between a first x-coordinate value of a first point of termination 308 of the first control panel device 302 and a second x-coordinate value of a second point of termination 309 of the second control panel device 303 based on the common point of origin for the control panel 328 (S638).

The common point of origin 328 for the control panel includes an x-axis, an y-axis, and a z-axis value, the VL is defined as a distance between a point of termination 308, 309 on a control panel device 302, 303 and a point above or below the control panel device 329, 330, and the CBR defines a length of a bend of the wire.

When the main controller 600 determines that the first and the second control panel devices are located vertically to each other and a direct routing scenario is applied (S606), the main controller 600 segments the wire into a plurality of wire segments and calculates a segment wire length for each of the plurality of wire segments (S613) and a total unadjusted wire length based on a summation of the segment wire length of each of the plurality of wire segments (S608).

Figure 6G:
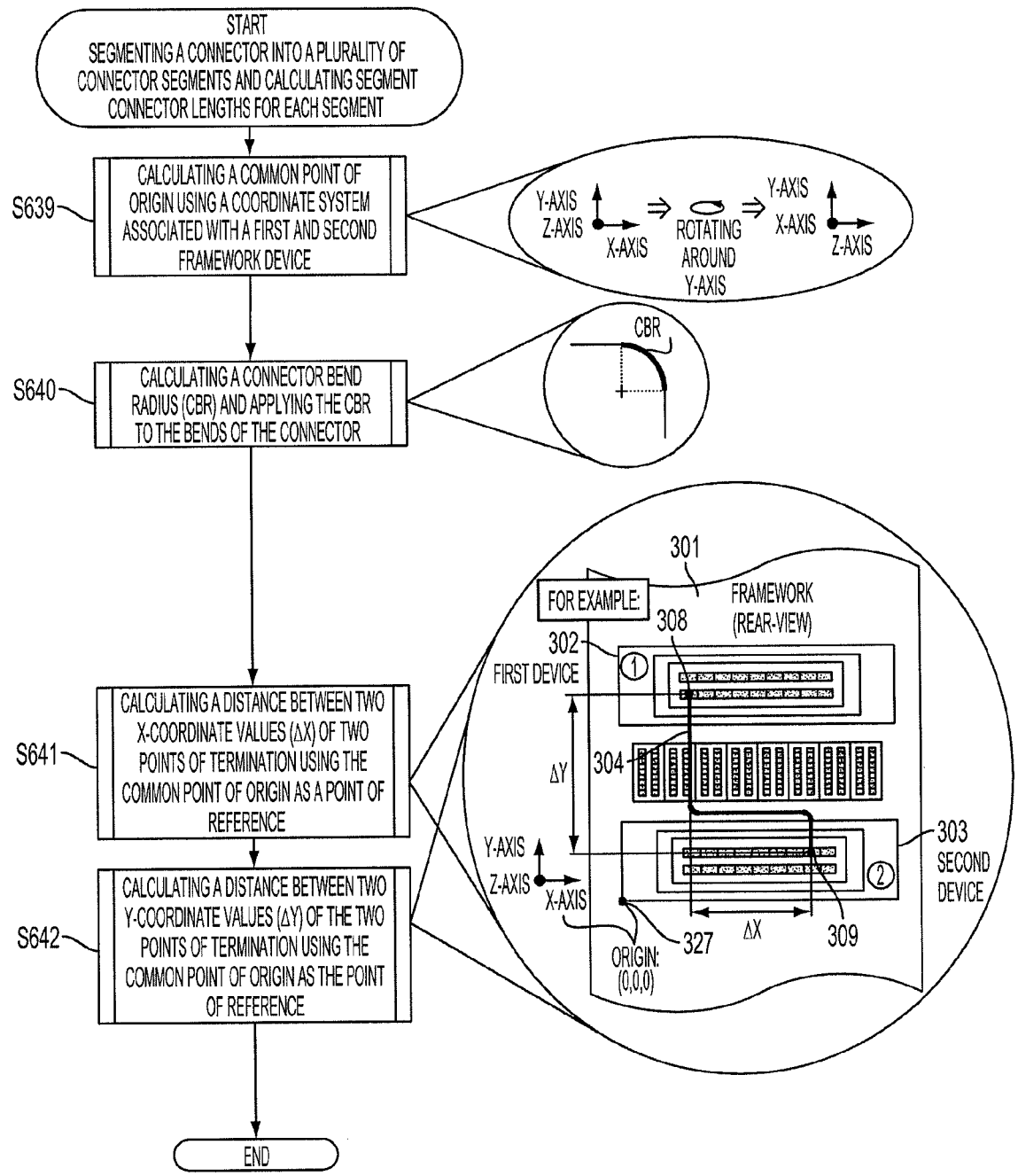
FIG. 6G is a flowchart explaining the segmenting of a connector into a plurality of connector segments and the calculation of the connector lengths for each segment for a connector installed between two framework devices which are located in positions vertically from each other when the connector is directly routed between the framework devices.

FIG. 6G is a flowchart explaining the segmenting of a connector (wire) into a plurality of connector segments and the calculation of the connector lengths for each segment for a connector installed between two framework (control panel) devices which are located in positions vertically from each other when the connector is directly routed between the framework devices.

To calculate the segment wire lengths for each of the plurality of wire segments when two control panel devices are vertically located to each other and when the wire is directly routed between the control panel devices, the main controller 600 calculates a common point of origin 327 for the first control panel device 302 and the second control panel device 303 using a Cartesian coordinate system (S639), a conductor bend radius (CBR) for each bend in the wire (S640), a distance $\Delta X$ between a first x-coordinate value of a first point of termination 308 of the first control panel device 302 and a second x-coordinate value of a second point of termination 309 of the second control panel device 303 based on the common point of origin 327 (S641), a distance $\Delta Y$ between a first y-coordinate value of the first point of termination 308 of the first control panel device 302 and a second y-coordinate value of the second point of termination 308 of the second control panel device 303 based on the common point of origin 327 (S642). The CBR defines a length of a bend of the wire.

When the main controller 600 determines that the first and the second control panel devices are located vertically to each other and a routing scenario around devices and along panel boundaries is applied (S603), the main controller 600 segments the wire into a plurality of wire segments and calculates a segment wire length for each of the plurality of wire segments (S604) and a total unadjusted wire length based on a summation of the segment wire length of each of the plurality of wire segments (S605).

FIG. 6C is a flowchart explaining the segmenting of a connector (wire) into a plurality of connector segments and the calculation of the connector lengths for each segment for a connector installed between two framework (control panel) devices which are located in positions vertically from each other when the connector is routed around the framework devices.

To calculate the segment wire lengths for each of the plurality of wire segments when two control panel devices are vertically located to each other and when the wire is routed around the control panel devices, the main controller 600 calculates a conductor bend radius (CBR) for each bend in the wire (S619), a vertical leave distance (VL) for each end of the wire (S620), a distance to framework edge (DFE) for each end of the wire (S621), a distance to framework boundary (DFB) for each end of the wire (S622), determines a control panel device placement of the first control panel device relative to the second control panel device (S623), and calculates a vertical distance (VD) between points along the control panel where the wire is routed (S624).

The DFE includes a horizontal component distance from a point of termination 309 to a panel edge 331 in preparation of vertical routing.

The DFB includes a total distance from the point of termination 309 to the panel edge 331 in preparation of vertical routing, and the VL is defines a distance between a point of termination on a control panel device 309 and a point above or below the control panel device 332. The CBR defines a length of a bend of the wire.

After the unadjusted total wire length is calculated, the main controller calculates an adjusted total wire length based on the unadjusted total wire length.

FIG. 6B is a flowchart explaining the calculation of an adjusted total connector length.

The calculation of the adjusted total connector length includes calculating and adding a waterfall adjustment to the total unadjusted wire length (S613) and (S614), and calculating and adding a net adjustment to the total unadjusted wire length modified by the waterfall adjustment (S616).

The waterfall adjustment includes a value to adjust the length of the wire relative to lengths of a plurality of other wires to obtain a predefined shape of a bundle formed by the wire and a plurality of other wires (S613), and the net adjustment includes a net adjustment factor applied by adding or subtracting a fixed distance value (S618). As an alternative, the main controller 600 may also apply a percent value to the unadjusted total wire length instead of applying a fixed distance value (S617).

Figure 7:
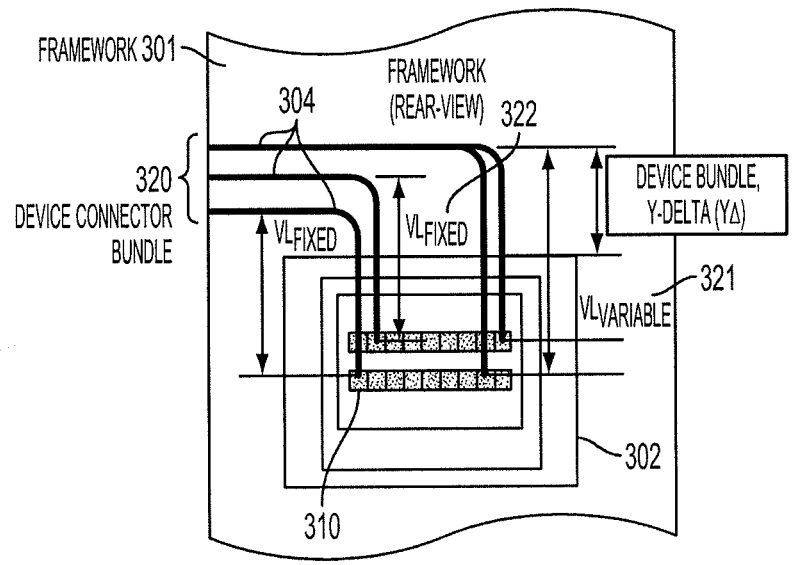
FIG. 7 is a view illustrating fixed and variable vertical leave distances.

FIG. 7 is a view illustrating fixed and vertical leave distances in conjunction with a wire length calculation. A leave distance defines a distance required from a point of termination 310 toward wire bundles 320 above or below a control panel device 302 on a control panel 301. The leave distance can be fixed or variable. In addition, a leave distance may be vertical or horizontal. When a wire is segmented to calculate a wire length, the leave distance may correspond to a wire segment length. FIG. 7 shows fixed vertical leave distance 322 and variable vertical leave distance 321.

The vertical distance between defines a vertical distance component connecting routed wiring from coordinate points associated with a panel edge end point as derived by using the distance to panel boundary (DPB).

The conductor bend radius (CBR) defines a distance represented when bending conductors based on a user-specified conductor radius (CR) to ensure accurate calculations based on standard wiring practices. The CBR is calculated based on the conductor radius (CR) according to the following equation: $CBR = \frac{1}{2}\pi CR$.

The net adjustment defines a net adjustment factor applied by adding or subtracting a fixed distance value to or from a total wire length or by applying a percent to the total wire length. The net adjustment factor is an adjustment that modifies the final calculated wire length by either adding/subtracting inches or a percentage of the calculated wire length. Net adjustment only applies to the total wire length.

Figure 8:
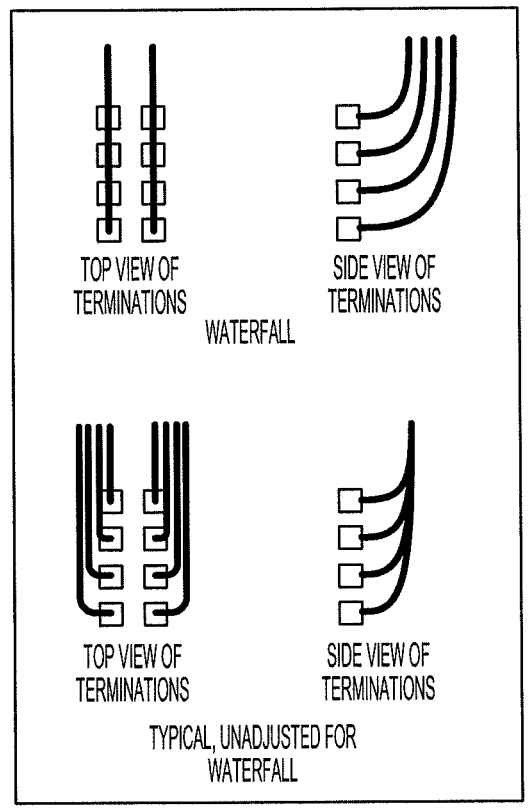
FIG. 8 is a view illustrating waterfall adjustment.

A waterfall adjustment defines adding a user-specified length per used (or connected) termination in a direction of wire routing for each device being terminated on for a particular wire. In other words, a waterfall adjustment is an adjustment to the total wire length that adds a length per used termination in the direction of wire routing on the device being terminated. The adjusted length allows for a waterfall affect wire termination method to be used which may be more aesthetically presentable than terminating wires with lengths unadjusted for other wires terminated with it in the direction of wiring. Waterfall adjustment is illustrated in FIG. 8.

In summary, the adjusted total wire length is calculated by segmenting the wire, by calculating a length for each wire segment, and by adjusting the unadjusted total wire length based on user selectable adjustment parameters.

Generating Reports

Reports are generated to provide information processed from raw data beneficial to the end-users. Examples for reports are termination count reports, compatibility reports, summary conductor reports, and detailed conductor reports. Reports can be stored in report files 12 or can be displayed on a display 70.

A termination count report includes information indicating a number of terminations per control panel for a field-side wiring and/or a panel-side wiring. When a termination count report is stored in a termination count report file 121, the termination count report contains calculation equations built into the termination count report file 121 which allows a user to track wiring installation performance.

The wiring installation performance includes safety-related measures, process benchmark measures as well as personnel performance measures. For example, personnel performance measures may include performance factors regarding the process of terminating wires onto devices. These factors can provide such information as average time to completion, average time per termination, electrician performance as compared to expected measurements, safety measures as related to number of terminations per panel requiring a certain number of motions of the hand, etc.

A compatibility report includes information indicating engineering drawing object data errors and/or physical wiring errors.

A summary conductor report includes information summarizing wire routing decisions made during the wire length calculation as an easy-to-read guide for personnel installing control panel wiring.

A detailed conductor report includes information regarding the wire routing decisions made during the wire length calculation as a guide for technical support personnel when the outcome of the wire length calculation was not as expected.

A report including the total number of terminations processed based on the extractable information from the engineering drawing file 20 may also be generated. This report, however, is only displayed on display unit 70 without generating a report file.

Printing of Connector Tags

The connector tag process includes the operations of generating connector tag printer control files 18, transferring the connector tag printer control files 18 to a connector tag printer controller 500 and printing the connector tags on a connector tag printer 900. Typically, a connector tag printer 900 is a thermal transfer printer such as a "Panduit" printer.

The connector tag printer control file 18 is generated in a document format acceptable by the connector tag printing device. The connector tag data in the connector tag printer control file 18 may be sorted by framework (control panel), framework device (control panel device) and stud. The sorting of the connector tag data may be text based. However, other methods for sorting connector text data may also be applied. Connector tag printer control files 18 may be generated for field-side or panel-side labels.

Connector tags are typically printed using a spool of heat-shrink labels using the thermal transfer printer for both panels wired in the wire shop for pre-installation of control panels and for control panels wired in the field if the connector tags are used as wire tags.

Generating Engraved Name Plates

When frameworks (control panels) are pre-connected (pre-wired), nameplates are placed on control panels prior to shipment of the control panels to the electrical substations where the control panels are installed by field electricians. The nameplate engraving process includes the operations of generating engraver control files 16, transferring the engraver control files to an engraver controller 400 engraving nameplates by an engraver 800.

The foregoing exemplary embodiments and advantages are merely exemplary and are not to be construed as limiting the present invention. The present teaching can be readily applied to other types of apparatuses, methods and systems. Also, the description of the exemplary embodiments of the present invention is intended to be illustrative, and not to limit the scope of the claims, and many alternatives, modifications, and variations will be apparent to those skilled in the art.

What is claimed is:

1. A method for processing information extractable from an engineering drawing file comprising:

modeling in the engineering drawing file at least two objects in a predefined format by adding at least two entities to the engineering drawing file and by adding support information to the engineering drawing file to provide the extractable information;

providing a program sequence in an automation application to establish a correlation of the extractable information;

correlating the extractable information by executing the program sequence;

generating output data based on the established correlation of the extractable information; and in response to the output data, controlling at least one of a display, printer, engraver, and connector processing equipment, wherein the correlation of the extractable information is established only while the program sequence of the automation application is executed.

2. The method according to claim 1,
wherein the at least two objects comprise, respectively, a device and a connector, and
wherein the output data comprises a report and an equipment control file comprising control data configured to control an equipment, and
wherein the report is at least one of
(a) stored in a report file, and
(b) displayed on a display.

3. The method according to claim 2, wherein the modeling further comprises at least one of:
providing application process settings data,
providing a predefined equipment control file template,
adding attributes to the at least two entities, and
applying a predefined format to the at least two entities,
wherein the correlation comprises a temporary configuration of the automation application that establishes a temporary relationship between the at least two entities, the support information and the application process settings data, thereby providing additional information beyond the information about the at least two entities, the support information and the application process settings data,
wherein the support information comprises at least one of:
general settings information,
device specification information comprising device descriptive characteristics, device structural characteristics, device-level connector routing characteristics, device-level process settings, device termination definitions comprising coordinates of the device terminations in a coordinate system calculated from a point of origin defined for each device, termination-level connector routing characteristics, termination data assignments, framework characteristics, and termination interface characteristics, and
connector specification information comprising circuit type definitions, connector characteristics based on an applied circuit type, connector type symbol definitions, and characteristics of a connector end to adapt the connector end to a device termination to which the connector end is connected,
wherein the at least two entities comprise at least one of a text string formatted according to the predefined format, layers, and blocks of grouped entities, and
wherein the application process settings data comprises parameters for executing the automation application.

4. The method according to claim 3, wherein the generating of the equipment control file comprises at least one of:
generating a connector tag printer control file to control a connector tag printer;
generating an engraver control file to control an engraver; and
generating a connector processing equipment control file to control a connector processing equipment.

5. The method according to claim 4, wherein the generating of the connector processing equipment control file comprises:
calculating an adjusted total connector length of a connector based on the correlated extractable information,
wherein the correlated extractable information comprises:
information defining the topology of framework devices based on a coordinate system of each framework device,
locations of terminations to which the connector is connected in the coordinate system of each of the framework devices,
information defining the topology of the framework based on a coordinate system of each framework, and
locations of framework devices in the coordinate system of each framework.

6. The method according to claim 5, wherein the calculating of the adjusted total connector length comprises:
extracting the extractable information;
correlating the extractable information;
calculating a total unadjusted connector length based on at least one of a plurality of connecting scenarios; and
adjusting the total unadjusted connector length,
wherein the extracting of the extractable information comprises:
retrieving information about the at least two entities,
retrieving at least a part of the support information, and
retrieving the application process settings data, and
wherein the plurality of connecting scenarios comprises:
routing the connector around devices located above or below each other and along a framework boundary;
routing the connector around devices located side-by-side;
routing the connector from a framework device to a selected termination interface;
routing the connector from a first termination interface to a second termination interface;
routing the connector from a first termination of a single device to a second termination of the single device;
directly routing the connector from a first device to a second device without routing the connector around the first device and the second device and without routing the connector along the framework boundary, wherein the first device is located above or below the second device; and
directly routing the connector from the first device to the second device without routing the connector around the first device and the second device and without routing the connector along the framework boundary, wherein the first device and the second device are located side-by-side.

7. The method according to claim 6, wherein the adjusting of the total unadjusted connector length comprises:
calculating and adding a waterfall adjustment to the total unadjusted connector length;
calculating and adding a net adjustment to the total unadjusted connector length modified by the waterfall adjustment,
wherein the waterfall adjustment comprises a value to adjust the length of the connector relative to lengths of a plurality of other connectors to obtain a predefined shape of a bundle formed by the connector and a plurality of other connectors, and
wherein the net adjustment comprises a net adjustment factor applied by adding or subtracting a fixed distance value or by applying a percent value.

8. The method according to claim 6, wherein the calculating of the total unadjusted connector length comprises:
upon determining that the connector is a single connector on a same framework device and upon determining that a fixed connector length is used, retrieving a fixed connector length value and setting the retrieved fixed connector length value as the total unadjusted connector length;

upon determining that the connector is a single connector on a same framework device and upon determining that the fixed connector length is not used segmenting the connector into a plurality of connector segments, calculating a segment connector length for each of the plurality of connector segments, and calculating the total unadjusted connector length based on a summation of segment connector lengths of each of the plurality of connector segments.

9. The method according to claim 8, wherein the segmenting of the connector into the plurality of connector segments and the calculating of the segment connector lengths for each of the plurality of connector segments comprises:
   calculating a connector bend radius comprising a length of a bend of the connector and adjusting each segment connector length that contains at least one bend based on the connector bend radius,
   calculating a point of origin associated with the at least one device using a coordinate system associated with the at least one device;
   calculating a jumper leave distance;
   calculating a distance $\Delta X$ between a first x-coordinate value of a first point of termination of the at least one device and a second x-coordinate value of a second point of termination of the at least one device based on the point of origin;
   calculating a distance $\Delta Y$ between a first y-coordinate value of the first point of termination of the at least one device and a second y-coordinate value of the second point of termination of the at least one device based on the point of origin,
   wherein the jumper leave distance comprises a distance between the second point of termination on the at least one device and a point extending in a direction of termination.

10. The method according to claim 6, wherein the calculating of the total unadjusted connector length comprises:
    upon determining that the connector extends between a first framework device and a second framework device, determining a location of the first framework device and the second framework device relative to each other.

11. The method according to claim 10, further comprising:
    upon determining that the first and the second framework devices are located horizontally to each other, selecting a routing scenario,
    upon selecting the routing scenario to extend the connector in a direct manner, segmenting the connector into a plurality of connector segments, calculating a segment connector length for each of the plurality of connector segments, and calculating a total unadjusted connector length based on a summation of the segment connector lengths of each of the plurality of connector segments.

12. The method according to claim 11, wherein the segmenting of the connector into the plurality of connector segments and the calculating of the segment connector lengths for each of the plurality of connector segments comprises:
    calculating a common point of origin for the first framework device and the second framework device using a coordinate system associated with the first and second framework devices,
    calculating a connector bend radius comprising a length of a bend of the connector and adjusting each segment connector length that contains at least one bend based on the connector bend radius;
    calculating a jumper leave distance;
    calculating a distance $\Delta X$ between a first x-coordinate value of a first point of termination of the first framework device and a second x-coordinate value of a second point of termination of the second framework device based on the common point of origin;
    calculating a distance $\Delta Y$ between a first y-coordinate value of the first point of termination of the first framework device and a second y-coordinate value of the second point of termination of the second framework device based on the common point of origin,
    wherein the jumper leave distance comprises a distance between the second point of termination on the second framework device and a point extending in a direction of termination.

13. The method according to claim 10, further comprising:
    upon determining that the first and the second framework devices are located horizontally to each other, selecting a routing scenario,
    upon selecting the routing scenario to extend the connector around devices and along framework boundaries, segmenting the connector into a plurality of connector segments, calculating segment connector lengths for each of the plurality of connector segments, and calculating a total unadjusted connector length based on a summation of the segment connector lengths of each of the plurality of connector segments.

14. The method according to claim 13, wherein the segmenting of the connector into the plurality of connector segments and the calculating of the segment connector lengths for each of the plurality of connector segments comprises:
    calculating a common point of origin for the framework using a coordinate system associated with the framework,
    calculating a connector bend radius comprising a length of a bend of the connector and adjusting each segment connector length that contains at least one bend based on the connector bend radius;
    calculating a vertical leave distance for each of the connector ends;
    calculating a distance $\Delta X$ between a first x-coordinate value of a first point of termination of the first framework device and a second x-coordinate value of a second point of termination of the second framework device based on the common point of origin for the framework,
    wherein the vertical leave distance comprises a distance between a point of termination on a framework device and a point above or below the framework device.

15. The method according to claim 10, further comprising:
    upon determining that the first and the second framework devices are located vertically to each other selecting a routing scenario,
    upon selecting the routing scenario to extend the connector in a direct manner, segmenting the connector into a plurality of connector segments, calculating segment connector lengths for each of the plurality of connector segments, and calculating a total unadjusted connector length based on a summation of the segment connector lengths of each of the plurality of connector segments.

16. The method according to claim 15, wherein the segmenting of the connector into the plurality of connector segments and the calculating of the segment connector lengths for each of the plurality of connector segments comprises:

calculating a common point of origin for the first framework device and the second framework device using a coordinate system associated with the first and second framework devices, calculating a connector bend radius comprising a length of a bend of the connector and adjusting each segment connector length that contains at least one bend based on the connector bend radius, calculating a distance $\Delta X$ between a first x-coordinate value of a first point of termination of the first framework device and a second x-coordinate value of a second point of termination of the second framework device based on the common point of origin;

calculating a distance $\Delta Y$ between a first y-coordinate value of the first point of termination of the first framework device and a second y-coordinate value of the second point of termination of the second framework device based on the common point of origin.

17. The method according to claim 10, further comprising:

upon determining that the first and the second framework devices are located vertically to each other, selecting a routing scenario, upon selecting the routing scenario to extend the connector around devices and along framework boundaries, segmenting the connector into a plurality of connector segments, calculating segment connector lengths for each of the plurality of connector segments, and calculating a total unadjusted connector length based on a summation of the segment connector lengths of each of the plurality of connector segments.

18. The method according to claim 17, wherein the segmenting of the connector into the plurality of connector segments and the calculating of the segment connector lengths for each of the plurality of connector segments comprises:

calculating a connector bend radius comprising a length of a bend of the connector and adjusting each segment connector length that contains at least one bend based on the connector bend radius, calculating a vertical leave distance for each end of the connector;

calculating a distance to framework edge for each end of the connector;

calculating a distance to framework boundary for each end of the connector;

determining a framework device placement of the first framework device relative to the second framework device;

calculating a vertical distance between points along the framework where the connector is routed, wherein the distance to framework edge comprises a horizontal component distance from a point of termination to a framework edge in preparation of vertical routing, wherein the distance to framework boundary comprises a total distance from the point of termination to the framework edge in preparation of vertical routing, wherein the vertical leave distance comprises a distance between a point of termination on a framework device and a point above or below the framework device.

19. The method according to claim 1, wherein, to prevent the extractable information from being correlated without the automation application being executed, the program sequence included in the automation application and the at least two objects are modeled in the engineering drawing file in the predefined format, and wherein the correlation is accessible only by the automation application.

20. An automation system comprising:

a non-transitory computer-readable medium storing at least one engineering drawing file and an automation application comprising a program sequence; and a main controller configured to:

model in the at least one engineering drawing file at least two objects in a predefined format by adding at least two entities to the at least one engineering drawing file and by adding support information to the at least one engineering drawing file to provide extractable information, execute the program sequence of the automation application to establish a correlation of the extractable information, and generate output data based on the established correlation of the extractable information;

a connector tag printer controlled by a connector tag printer controller based on at least one equipment control file and configured to print connector tags;

an engraver controlled by an engraver controller based on the at least one equipment control file and configured to engrave nameplates; and a connector processing equipment controlled by a connector processing equipment controller based on the at least one equipment control file and configured to cut a connector to a length, to print information on the connector, and to prepare both ends of the connector for installation, a file converter configured to convert the at least one equipment control file into a format specific to the connector processing equipment, wherein the correlation of the extractable information is established only while the program sequence of the automation application is executed, and a communication controller to transmit the output data to the connector tag printer controller, the engraver controller, the file converter, and the connector processing equipment controller.

21. The automation system according to claim 20, wherein the at least two objects comprise, respectively, at least one device and a connector, wherein the output data comprises at least one of a report and an equipment control file comprising control data configured to control an equipment, and wherein the report is at least one of (a) stored in a report file, and (b) displayed on a display.

22. The automation system according to claim 21, wherein, after the main controller generates a connector processing equipment control file, the communication controller transmits the connector processing equipment control file to the file converter and the file converter converts an equipment control file format and equipment control file data of the connector processing equipment control file into an equipment control file format and equipment control file data of a converted connector processing equipment control file based on a predefined equipment control file template, to obtain a specific file and data format required by the connector processing equipment.

23. The automation system according to claim 21, wherein, when the main controller generates a connector tag printer control file, the main controller sorts connector tag labels by a framework ID, a device ID, and a termination ID, and
> wherein a connector tag identifies a node of a circuit between at least two terminations, and
> wherein the connector tag is assigned to at least one of a plurality of connectors that connect the at least two terminations of a given node of the circuit.

24. The automation system according to claim 21, further comprising:
a framework, and
a termination interface,
wherein the at least one device comprises at least one of:
a control panel of an electrical substation, a modular or prefabricated home, an optical telecommunication rack, a control panel device, a plumbing unit, and an optical control device,
wherein the framework comprises at least one of:
> the control panel, the modular or prefabricated home, and the optical telecommunication rack,
wherein the connector comprises at least one of:
> a wire, a pipe, a conduit, and an optical fiber,
wherein the connector is configured to transport at least one of:
electrons, photons, gas, fluids and other matter,
wherein the termination interface comprises at least one of:
an electrical terminal block,
an interface at which at least two ends of two pipes or conduits are connected, and
an interface at which at least two optical fiber ends connected,
wherein the at least one engineering drawing file comprises at least one of:
> an elevation diagram which defines a layout of at least one framework and a location of the at least one device on the at least one framework and
> a connecting diagram which defines a method of physical connecting by illustrating the at least one device on the at least one framework, at least one beginning termination of at least one connector, and at least one end termination of the at least one connector.

25. The automation system according to claim 21, wherein, when the main controller generates the report, the main controller generates at least one of:
a termination count report, a compatibility report, a summary connector report, a detailed connector report; and
a total number of terminations report,
wherein the total number of terminations report is only displayed on the display without generating a report file,
wherein the termination count report comprises information indicating a number of terminations per framework for at least one of a field-side connection and a framework-side connection,
wherein the termination count report, when stored in the report file, comprises calculation equations built into the report file to allow a user to track performance of connector installation,
wherein the compatibility report comprises information indicating at least one of engineering drawing file errors and physical connecting errors,
wherein the summary connector report comprises information summarizing connector routing decisions made during a connector length calculation as a guide for personnel installing framework connections, and
wherein the detailed connector report comprises information regarding the connector routing decisions made during the connector length calculation as a guide for technical support personnel to assess accuracy of a given connector length calculation.

26. The automation system according to claim 20, wherein the automation system further comprises a design processor which displays a user interface on a display to model the at least two objects in the predefined format, and
wherein the output data comprises a compatibility report which lists entities and support information that do not correspond to the predefined format.

27. The automation system according to claim 20, wherein the connector processing equipment is configured to cut a connector to a length, to print information on the connector, and to prepare both ends of the connector for installation, and
wherein the information printed on the connector comprises at least one of installation instructions, at least a part of the connector specification information, a connector tag, a destination, a source, and routing information.

28. An apparatus comprising:
a non-transitory computer-readable medium storing at least one engineering drawing file and an automation application comprising a program sequence; and
a main controller configured to:
model in the at least one engineering drawing file at least two objects in a predefined format by adding at least two entities to the at least one engineering drawing file and by adding support information to the at least one engineering drawing file to provide the extractable information,
execute the program sequence of the automation application to establish a correlation of the extractable information, and
generate output data based on the established correlation of the extractable information,
wherein the correlation of the extractable information is established only while the program sequence of the automation application is executed, and wherein at least one of a display, printer, engraver, and connector processing equipment is controlled in response to the output data.

29. The apparatus according to claim 28, wherein the main controller is further configured to:
provide application process settings data and a predefined equipment control file template,
add attributes to the at least two entities, and
apply a predefined format to the at least two entities,
wherein the correlation comprises a temporary configuration of the automation application that establishes a temporary relationship between the at least two entities, the support information and the application process settings data, to provide additional information beyond the information about the at least two entities, the support information, and the application process settings data,
wherein the support information comprises at least one of
general settings information,
device specification information comprising device descriptive characteristics, device structural characteristics, device-level connector routing characteristics, device-level process settings, device termination definitions comprising coordinates of the device terminations in a coordinate system calculated from a point of origin defined for each device, termination-level connector routing characteristics, termination data assignments, framework characteristics, and termination interface characteristics, and connector specification information comprising circuit type definitions, connector characteristics based on an applied circuit type, connector type symbol definitions, and characteristics of a connector end to adapt the connector end to a device termination to which the connector end is connected, wherein the at least two entities comprise at least one of a text string formatted according to the predefined format, layers, and blocks of grouped entities, and wherein the application process settings data comprises parameters for executing the automation application.

30. The apparatus according to claim 29, wherein the main controller is further configured to:

store the application process settings data in an application configuration file, store at least a part of the support information in a relational database, store the predefined equipment control file template in a predefined template file, and wherein programmatic macros are embedded in the predefined template file which are executed to convert data provided in a predefined format to a control data file format compatible with and configured to control the connector processing equipment.

31. The apparatus according to claim 28, further comprising:

a display to display a graphical user interface including a main window, a process options selection dialog window, an advanced settings dialog window, and processed information comprising reports;

the main controller being further configured to control features of the graphical user interface and to control the display of the processed information comprising reports; and a memory configured to store a relational database.

* * * * *